United States Patent [19]
Finnila

[11] 3,970,993
[45] July 20, 1976

[54] COOPERATIVE-WORD LINEAR ARRAY PARALLEL PROCESSOR

[75] Inventor: Charles A. Finnila, Los Angeles, Calif.

[73] Assignee: Hughes Aircraft Company, Culver City, Calif.

[22] Filed: Jan. 2, 1974

[21] Appl. No.: 430,304

[52] U.S. Cl. .................................. 340/172.5
[51] Int. Cl.² .............................. G06F 15/16
[58] Field of Search ............... 445/1; 340/172.5

[56] References Cited
UNITED STATES PATENTS

| | | | |
|---|---|---|---|
| 3,544,973 | 12/1970 | Borck et al. | 340/172.5 |
| 3,611,307 | 10/1971 | Podvin et al. | 340/172.5 |
| 3,623,014 | 11/1971 | Doelz et al. | 340/172.5 |
| 3,668,650 | 6/1972 | Wang | 340/172.5 |
| 3,701,976 | 10/1972 | Shively | 340/172.5 |
| 3,702,986 | 11/1972 | Taylor et al. | 340/172.5 |
| 3,710,351 | 1/1973 | Nakamura | 340/172.5 |
| 3,725,872 | 4/1973 | Balogh et al. | 340/172.5 |
| 3,761,879 | 9/1973 | Brandsma et al. | 340/172.5 |
| 3,815,095 | 6/1974 | Wester | 340/172.5 |

Primary Examiner—Mark E. Nusbaum
Attorney, Agent, or Firm—John M. May; Rafael A. Cardenas; William H. MacAllister

[57] ABSTRACT

A "cooperative-word" linear array parallel processor comprises many logically identical memory words or micro-processors ordered in a linear array by a Chaining channel. Inasmuch as the Chaining channel can contain different information (either data to be processed or control information) at each word position, it permits highly parallel word-cooperative operations such as pair-wise arithmetic. The processor also has several global communication channels in which data may be transferred between an external buffer and a specified subset of processor words. Inasmuch as individual words may be addressed by their content rather than by their physical locations, relatively simple switching logic within each word provides effective self-repair. A plurality of flag flip-flops in each individual cell interact with gobal control lines to activate processing within a particular cell and to indicate the results of operations performed by that cell. Flag data can be passed from one word to another by means of the chaining channel, or they can be manipulated within a word by means of the aforesaid global control lines.

17 Claims, 27 Drawing Figures

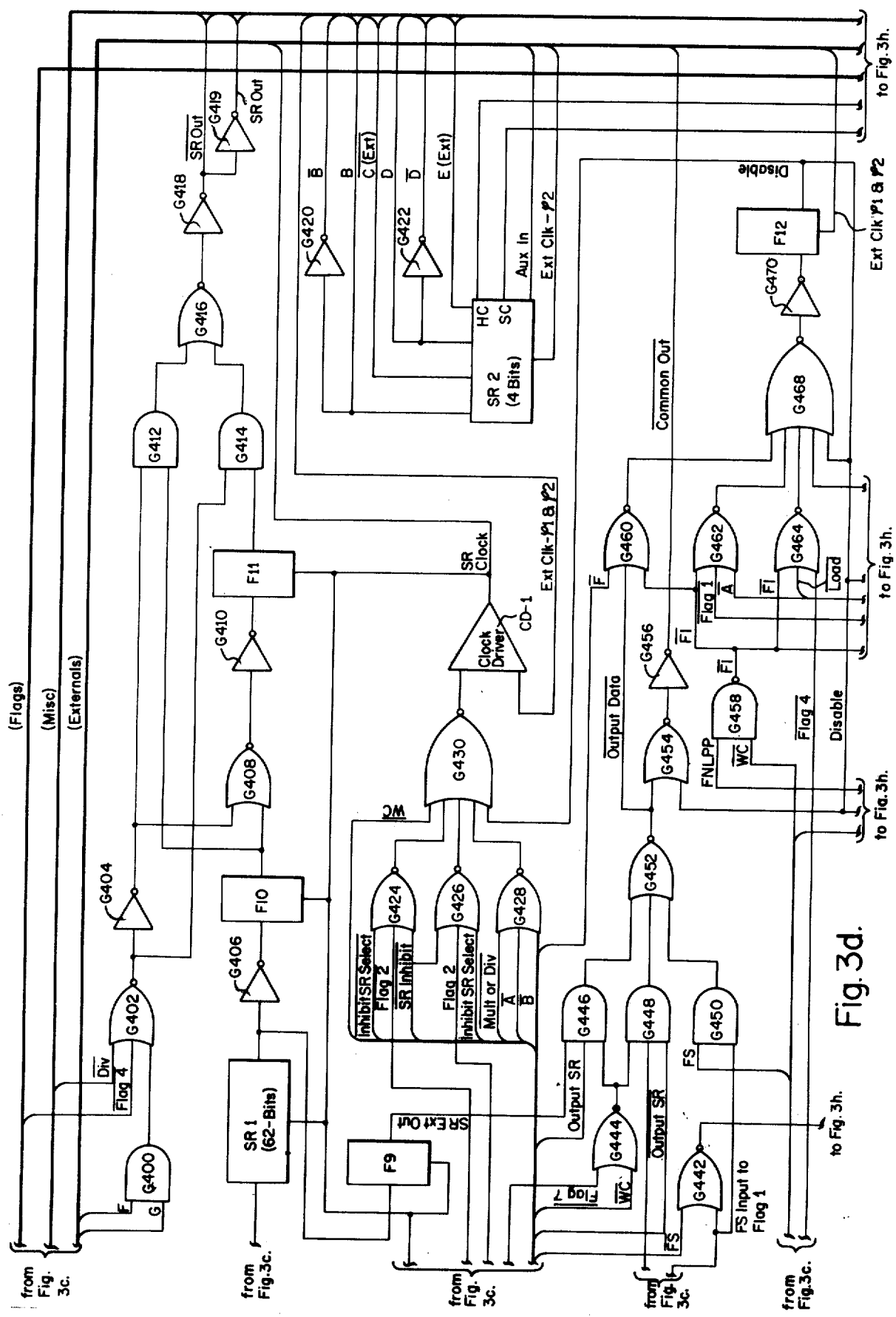

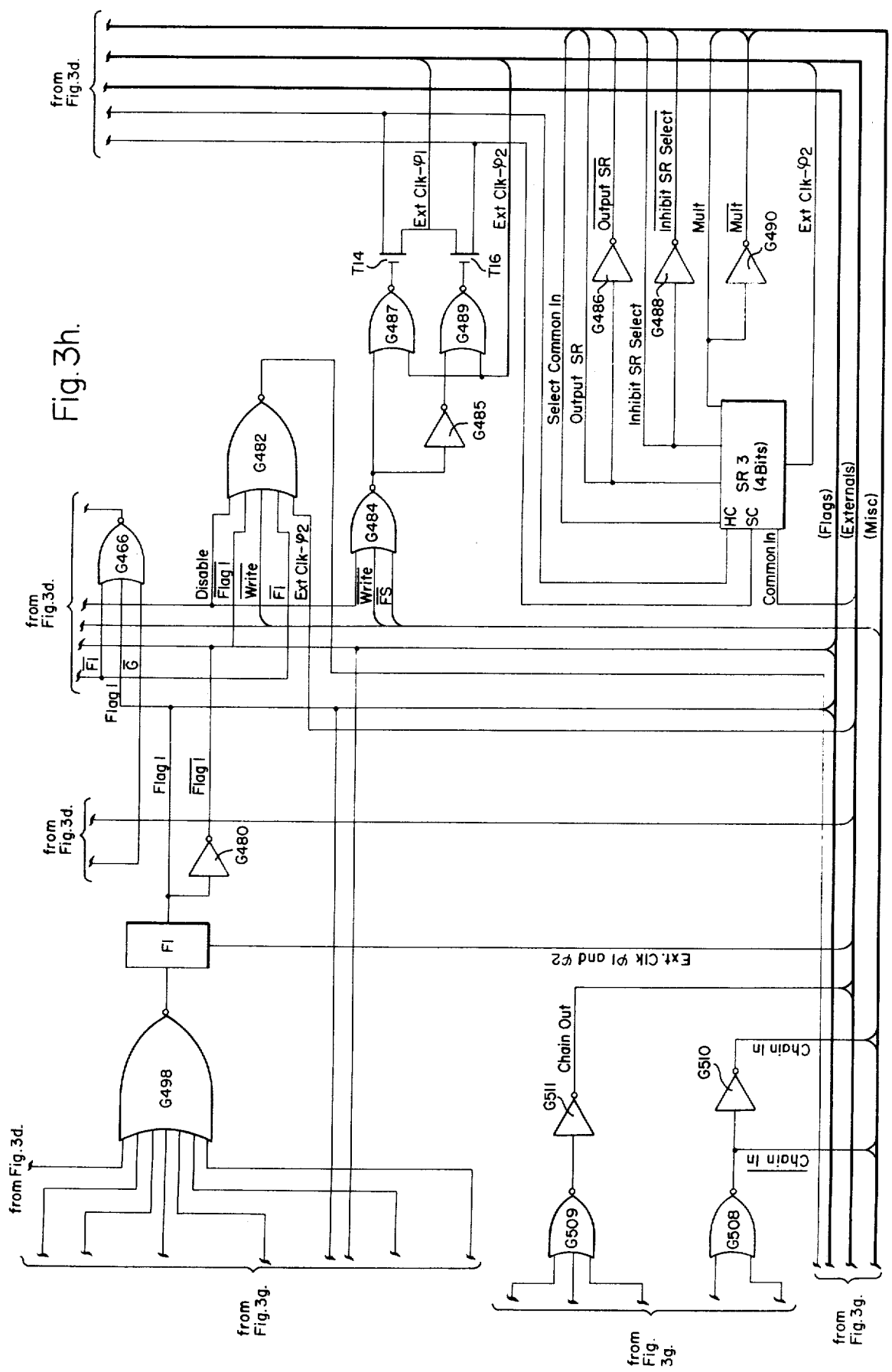

Fig. 4

| Global Command | Word State | Flag 2 | Flag 3 | Action |
|---|---|---|---|---|
| Word Chain | Relay | 0 | 0 | Chain In → [Shift Register with Head Flag] → Chain Out |
| | Chain | 0 | 1 | Chain In → [ ] → Chain Out |
| | Clocked Relay | 1 | 0 | Chain In → [ ] → Chain Out |
| | Re-circulate | 1 | 1 | [ ] → Chain Out (recirculating) |
| Position Hold | Re-circulate | 0 or 1 | 0 or 1 | Same as Recirculate Above |
| Flag Transfer | Relay | 0 | 0 | Same as Relay Above |
| | Flag Spread | 0 | 1 | Chain In → [ ] → Chain Out |
| | Clocked Relay | | | Same as Clocked Relay Above |
| | Ored Relay | 1 | 1 | Chain In → [ ] → Chain Out |

Chaining Channel Word Actions

Fig. 5

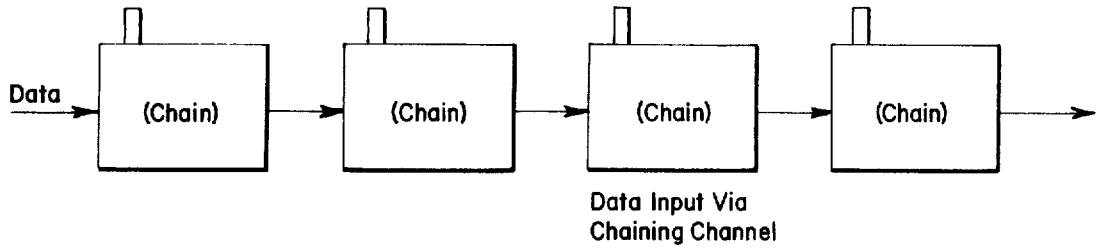

Data Input Via Chaining Channel

Short Data Transfer
BCDE → ACDB

Long Data Transfer
BCYZ → ACYB

Add in Place B → A+B

Chaining Add C → A+B

Data Copying
ABCD→ABBC

Ordered Data Deletion
BCDE→ABCE

Division

Add From a Distance
D→A+D

Multiple Add B, C, D, E
→ A, A+B, A+B+C,
A+B+C+D

Multiplication

COOPERATIVE-WORD LINEAR ARRAY PARALLEL PROCESSOR

TABLES OF CONTENTS

COOPERATIVE-WORD LINEAR ARRAY PARALLEL PROCESSOR
FIELD OF THE INVENTION
SUMMARY OF THE INVENTION
Background
 1. The Solomon machine
 2. PEPE
 3. The Holland machine
 4. The Various Associative Processors
Objects
The Present Invention
BRIEF DESCRIPTION OF THE DRAWINGS
DETAILED DESCRIPTION OF A PREFERRED EMBODIMENT
Introduction
 1. Processor Architecture
 2. The Individual Processing Cell
Functional Description of the Various Modes
 1. Data and Control Lines
 2. Fault Isolation Mode
 3. Flag Shift Mode
 4. Word Cycle Mode
Detailed Functional Description of the Individual Cell
 1. Data Routing
   (TABLE 1)
 2. Intra-Cell Control Lines
 3. Auxiliary Input Line
 4. Arithmetic and Logical Operations
   a. Match
   b. Approximate Match
   c. Greater Than or Equal
   d. Less Than
   e. Exclusive-OR
   f. Add
   g. Subtract
   h. Multiply and Divide
    h1. Multiply
     (TABLE 2)
    h2. Divide
   i. Square Root
Detailed Logical Description of the Individual Cell
 1. Chain In Selection
 2. Data Shift Register
 3. Chain Out
 4. Common Output
 5. Adder
 6. Miscellaneous Arithmetic Logic
 7. Flag Shift Operations
 8. Stored Control Lines
 9. Disable
Basic Programming Considerations
 1. Chaining Channel
   a. Interword Data Exchange Operations
   b. Word Selective Data Shifting
   c. Some Uses of the Chaining Channel
 2. Other Data Communication Channels
 3. Match and Short Arithmetic Operations
   (TABLE 3)
 4. Extended Arithmetic Operations
 5. Effective Self-Repair
 6. Processing Control and Setup
   a. Processing Modes
   b. Simultaneous Operations
   c. Processing Speed
    (TABLE 4)
Programming Examples
 1. Parallel Arithmetic Computations
   (TABLE 5)
 2. Symbol String Searching

FIELD OF THE INVENTION

This invention relates generally to data processing machines, and in particular to "highly-parallel" processors, as distinguished from conventional "von Neumann" machines. A highly-parallel processor is a machine which can perform many separate operations simultaneously or else can perform the same operation simultaneously on many data or sets of data. In addition, this parallelism is of a high order, say at least fifty or a hundred. Thus conventional "multi-processing" machines cannot be considered as highly-parallel in the sense defined here.

SUMMARY OF THE INVENTION

Background

There are numerous examples of highly-parallel machines, many of which are just paper designs. Among the prior art highly-parallel machines are the following:

1. The Solomon Machine

This is a set of processors connected as a two-dimensional array. All of the processors operate under central control and, in addition, each processor can communicate with its four nearest neighbors via the array interface. The ILLIAC-IV is an example of a Solomon machine. Solomon machines are extremely fast on matrix-type operations. However, because of their two-dimensional architecture, such machines are not readily adaptable to the type of large-scale integration (LSI) wherein multiple cells are on a single wafer; furthermore, a failure in a single processor renders all the other processors in the same row and column relatively useless.

2. PEPE, the Parallel-Element Processing Ensemble.

This machine is also a fixed set of processors with central control. There is no array interface as on the Solomon machine. However, PEPE contains an associative memory whose parts are assigned to the individual processors. Operations on this memory serve to determine which of the processors will perform each (centrally directed) operation. PEPE machines are designed to be extremely fast in applications involving the application of the same algorithm to many sets of data simultaneously. The principal potential use of a PEPE machine would appear to be as a special purpose peripheral in a large system, inasmuch as it lacks the pre-configuration flexibility required to efficiently perform unrelated tasks concurrently.

3. The Holland Machine

This machine consists of a great many very simple (and identical) processing elements connected as a two-dimensional array. Each element contains only a single data item or a single instruction. Unlike the machines just described, control is not central in the Holland machine. Instead, the individual elements can initiate and control their own operations (that is, those elements which happen to contain instructions). Thus the Holland machine is capable of performing many different processes (and operating on many different sets of data) simultaneously, with each instruction-containing element processing its own data and passing on its control to another element independently of other operations being performed in the machine. The communication of data and control is via the array linkage. No large Holland machine has been built. These machines suffer from being extremely difficult to program, and from the fact that the array linkage is inadequate for handling the complexity of operations of which the machine is capable without serious conflicts in the communication of data and control.

4. The Various Associative Processors

These machines all operate parallel-by-word and have logic distributed at every word position (and often at every bit position as well). The control is central, and there is always one and only one common operand in every parallel operation. That is, the parallelism in an associative processor is always between the single operand and the contents, or partial contents of a subset of the memory words. Many associative processors also have the capability of performing arithmetic and logical operations on subsets of the same memory word.

Objects

Accordingly, a principal object of the present invention is to provide a greater degree of parallelism than is to be found in prior art multi-processing machines.

Another related object is to permit different types of operations to be executed simultaneously; for example, arithmetic, data input and data output operations.

Yet another object of the present invention is to provide for more efficient parallel processing of data by permitting arguments to come either from a common input or from neighboring words.

Still another object of the present invention is to provide a highly parallel data processor having a flexible record size with field boundaries being dynamically variable.

A further, related object is to provide a highly parallel processor wherein memory can be divided into various sized regions for the various data dependent upon the nature of the problem being solved.

An overall objective of the present invention is to provide a cooperative word parallel processor which combines content addressable memory data storage with a capability for efficient parallel arithmetic and logic operations on the data.

It is a specific object of the present invention to lower the cost of array processors by providing a cellular architecture that can be fabricated as linear arrays on full LSI wafers using P-MOS or other state-of-the-art semiconductor technology with 2-layer metalization.

The Present Invention

These and other objectives are satisfied by a "cooperative word" highly-parallel processor comprising a linear array of logically identical memory cells constructed in accordance with the present invention, the individual cell having no individual hardware-addressing logic as such but addressable by its contents or by means of its relative position on a chaining channel which orders the words into a linear array.

Such a cooperative word processor has several communication channels. These are - in the embodiment described in detail below - the Common Input channel, the Chaining, the Auxiliary Input, and the Common Output channels. Each of these channels may be bit-serial in operation. The Common channel is the communication channel over which information in an external compare register is compared simultaneously with the contents of selected words in the memory, added to selected words, or otherwise used as a common operand in arithmetic operations.

The Chaining channel permits information to be transferred from word-to-word within the memory. There is only one such channel and it may even be unidirectonal. Nevertheless, it permits such operations as pairwise parallel arithmetic and the copying of information from one word into another word. Unlike the Common channel, the Chaining channel can contain different information at each word position. Depending on the setting of a Flag register provided as part of the individual word logic, the information transferred to the next word via the Chaining channel may be either the information on the Chaining channel from the previous word or the contents of the word itself or control information (flag data) or else results of logical or arithmetic operations between the input information and the word itself.

The Auxiliary Input and the Common Output channels, like the Common Input channel, each contain the same information at all word positions. They respectively carry information that it input to or output from a set of wrods selected by logic at each word position.

Since the four channels are logically independent to a very great extent, information may be transmitted over all four of them simultaneously during the simultaneous performance of several different tasks. For example, input, output, and pairwise parallel addition may be performed at the same time. Moreover, several different operations involving only the Chaining channel can be performed simultaneously, provided that there are no conflicts among the data on the Chaining channel (i.e., no overlapping paths for different items of data).

The cooperative-word parallel processor of the present invention also has the capability of an associative processor, so it could be termed an associative processor. However, it has a great deal of additional logic and also a much different emphasis as to the kind of parallel-by-word ("word-cooperative") associativity inherent in its logic; that is, it permits pairwise parallel operations between words within the memory independent of any single common operand. In actual programs written for the machine, the associative-memory types of operations tend to play a subsidiary role. The primary parallel operations are those which take advantage of the ability to communicate internally between many pairs of words in parallel and to operate on these pairs (hence, the term "Cooperative-Word"). It shares with the Solomon machine and PEPE the capability of operating on many sets of data simultaneously. However, it has the advantage over those machines that the division of the memory into regions for the individual data sets is determined by the software, rather than by the number and size of the individual physical processing elements. Thus, it can operate in parallel with equal efficiency, regardless of the number or size of the data sets, the only limitation being on the overall size of the single Cooperative-Word memory.

As with all associative memories, the logic resident in each cell can be operated word-parallel. However, within each word of the preferred embodiment disclosed, logic operates serial-by-bit, and data storage is provided by a serial shift register. Each cell contains a bit-serial adder for match-comparison and word arithimetic. Word inputs and outputs are all single lines for bit-serial data transfer.

Operations within words are controlled by the interaction between the common control lines and a plurality of individual Flag flip-flops which are part of each individual cell. The Flags stored in these flip-flops also activate processing within the particular cell and indicate the results of processing operations, such as matches or overflow.

The logic of the individual word cells is partitioned so that different types of operations can be executed in the processor simultaneously, even in the same words. In the embodiment disclosed, one arithmetic or matching operations, one data transfer operation on the chaining channel, one data input operation, and one data output operation can all be performed simultaneously during the same memory word cycle. This type of parallelism is in addition to the parallelism of doing the same operation in many different words simultaneously.

This processing approach is made practical by careful coordination of the processor design to LSI (large scale integrated circuit) technology. The basic processor may be built from many copies of the same LSI wafer. This wafer is the basic building block. Each wafer, in turn, contains many copies of the same basic word cell. Each word cell contains one word of processor memory along with arithmetic and control logic. In the embodiment described, only 18 conductive pads are needed per cell, and there are only 20 leads per wafer. These characteristics promote low-cost producibility. One layer of metallization defines the cells. A second layer of metal is applied to interconnect all good cells on the wafer into a linear array. All the good cells are used on each wafer because it is not necessary to have the same number of good cells on each wafer.

The discretionary connection technique used with this second layer metal is not the only means possible with the present invention for assuring high manufacturing wafer yield and low cost processor maintainability. The design of the individual processor cells is such that a software cell test program can be run at any time in order to detect any bad cells. Additional logic is included with each cell so that bad cells may be turned "off" (that is, bypassed and its output disabled) under program control. A turned-off cell does not interfere with the proper operation of other good cells. Although for normal operation each word uses only one chaining input, in the interest of maintainability, the logic of the preferred embodiment disclosed provides at least two. Data is supplied from the word two back as well as being provided from the previous word. This provides an alternative to the previous word in case that word's chaining logic should fail. A Fault Isolation operation changes Chaining channel inputs in certain words. As long as a few extra words are provided initially, hardware memory repairs should not be needed.

BRIEF DESCRIPTION OF THE DRAWINGS

FIG. 2, comprising FIGS. 2a and 2b, illustrates in functional block diagram form the major components of a processing cell constructed in accordance with the present invention, with FIG. 2a showing possible paths of data flow during a "Word Cycle" operation, while FIG. 2b shows data flow during a Flag Shift operation.

FIGS. 4 through 17 illustrate the flow of data from one cell to another during typical data processing sequences.

DETAILED DESCRIPTION OF A PREFERRED EMBODIMENT

Introduction

1. Processor Architecture

Figure 1:
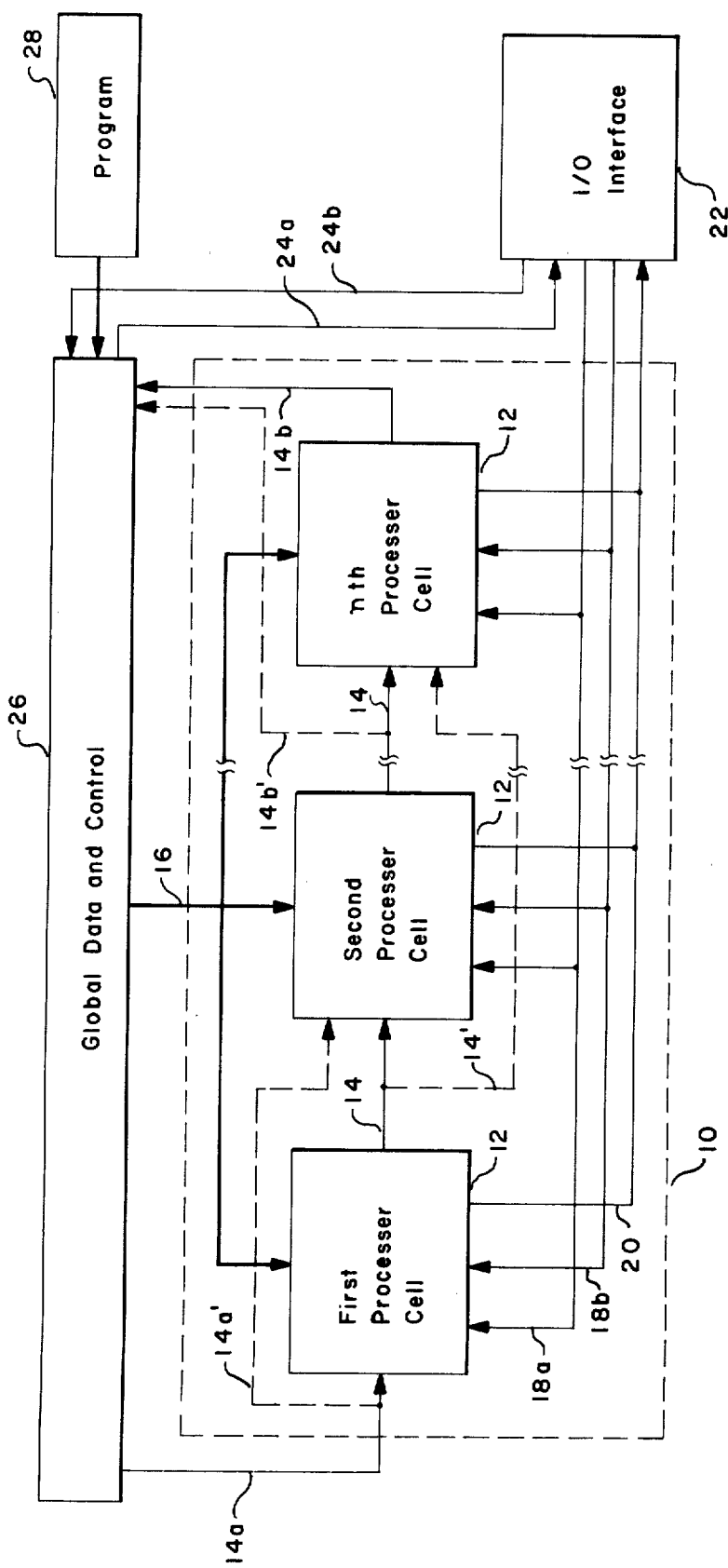
FIG. 1 illustrates in block diagram form the major components of a cooperative word linear array processor in accordance with the present invention.

Referring now with particularity FIG. 1 wherein the basic architecture of the processor is illustrated, it may be seen that the processing array 10 comprises a linear array of cells 12, each cell comprising data word storage together with associated arithmetic and control logic (thereby forming in essence an array of individual microprocessors).

Each associative memory cell consists of a 64-bit data Shift Register for data storage, seven Flag flip-flops for controlling operations to be performed (or not performed) within the cell, a Disable flip-flop for functionally disconnecting the cell in case a fault is detected in the cell, a Chaining Input Select flip-flop for bypassing the Channel Output from a bad cell, a full adder for use in arithmetic and logical operations, and miscellaneous control logic.

The individual cell, including the above-mentioned Data Shift Register, flip-flops, and other logic will be described hereinafter in greater detail with reference to the remaining figures.

The memory cells are serially arranged along a unidirectional communication channel 14, known as the Chaining Channel. Although the figure illustrates an array of only three cells, it should be noted that, in a typical application, a much larger array may be utilized, perhaps on the order of 32,000 words or cells. The data in one cell can thus be transmitted down the Chaining channel 14 to any other cell. Data can also be entered into a cell by the Common Input and Auxiliary Input lines 18a and 18b, which are external lines common to all cells, Alternate Chaining Input 14a' and Alternate Chaining Output 14b' are also provided in the interest of reliability and repairability, particularly when more than one cell is physically located on the same LSI wafer.

External to the processing array 10 are an input/output interface 22 through which external inputs and outputs are passed. Interface 22 is connected by a data bus 24a and 24b to a Common Data Control buffer 26 which also receives stored data and instruction words from external program memory 28. Not shown in FIG. 1 are the power supply and clock lines used to power the individual cells.

2. The Individual Processing Cell

Figure 2A:
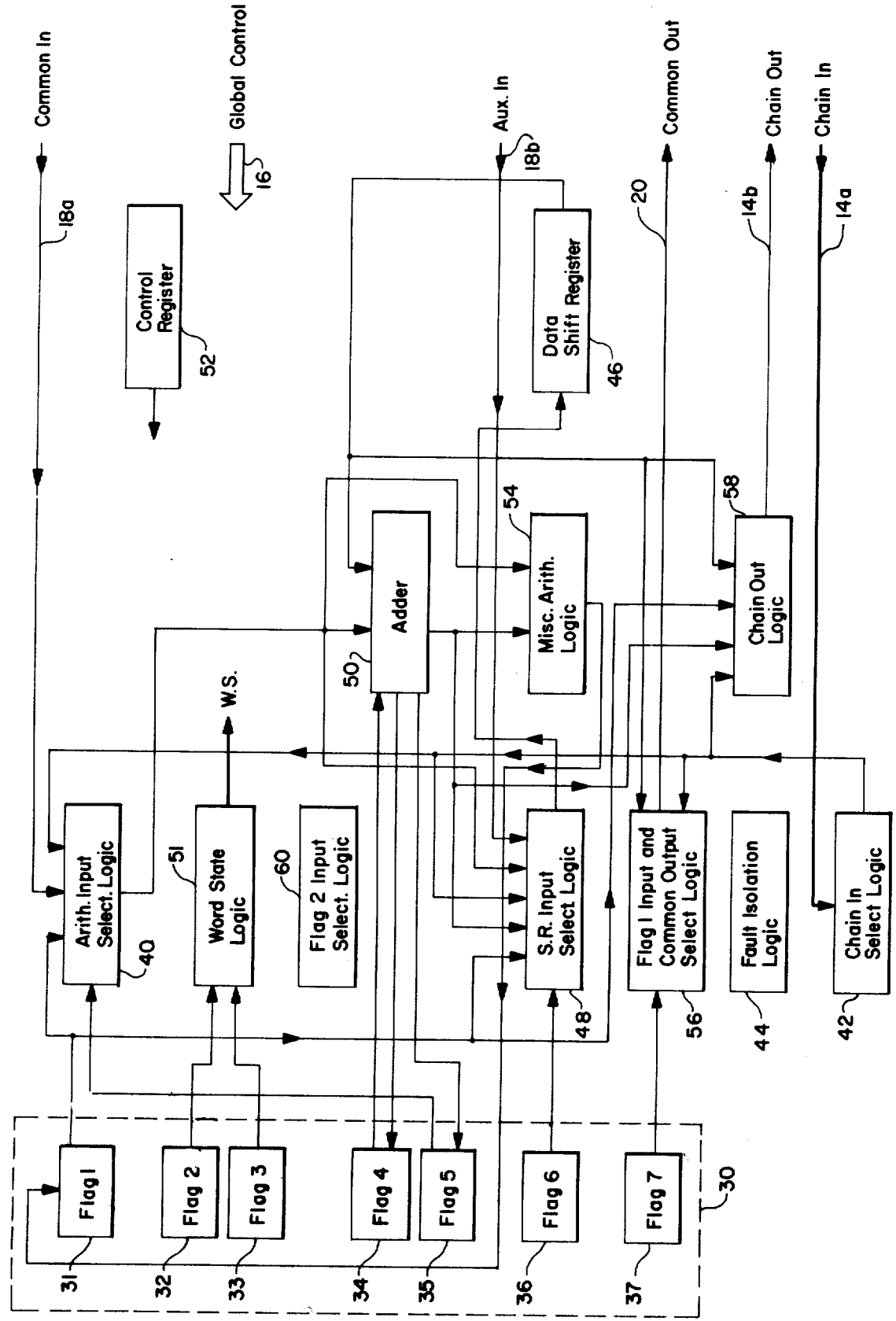
Figure 2B:
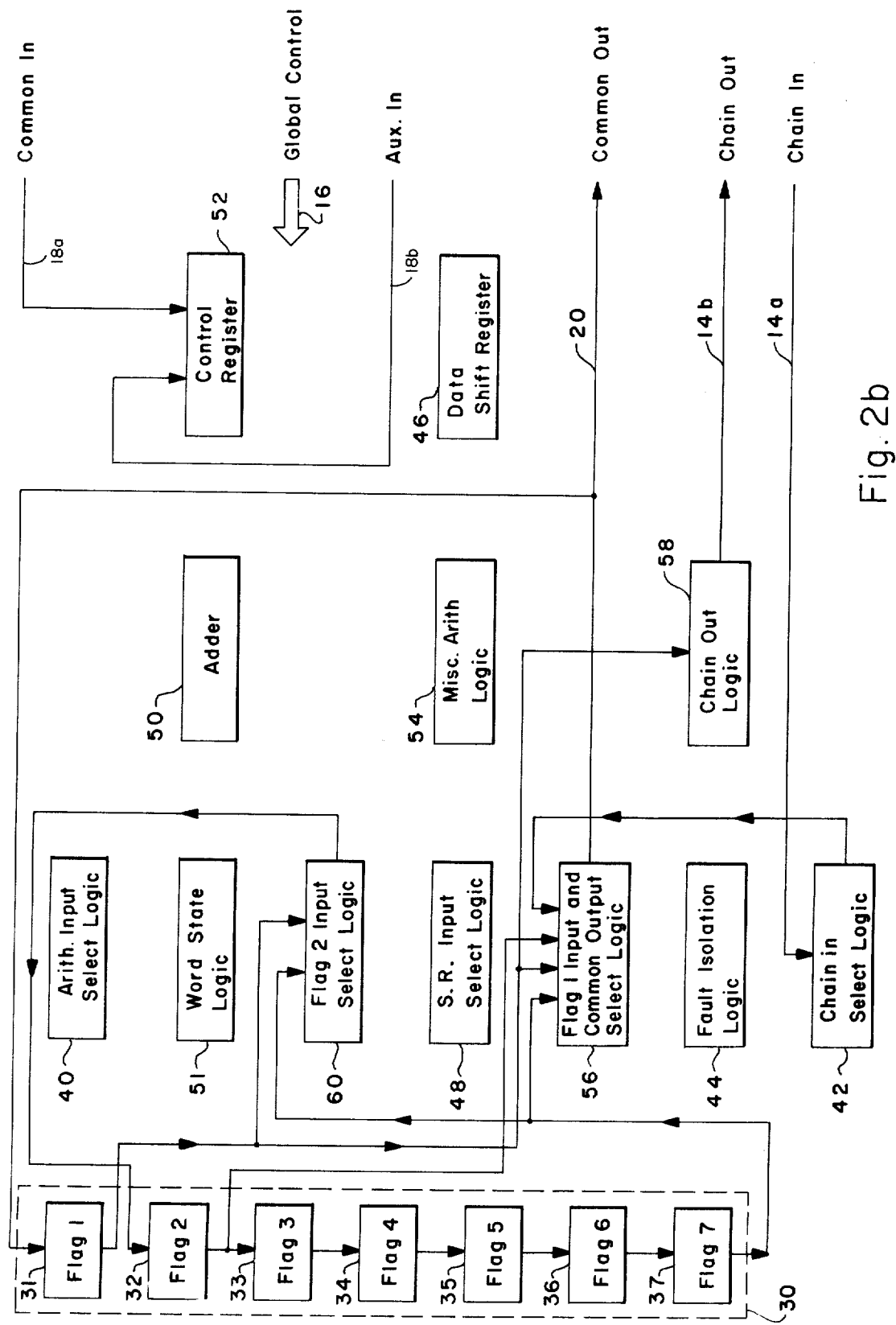
Figure 3A:
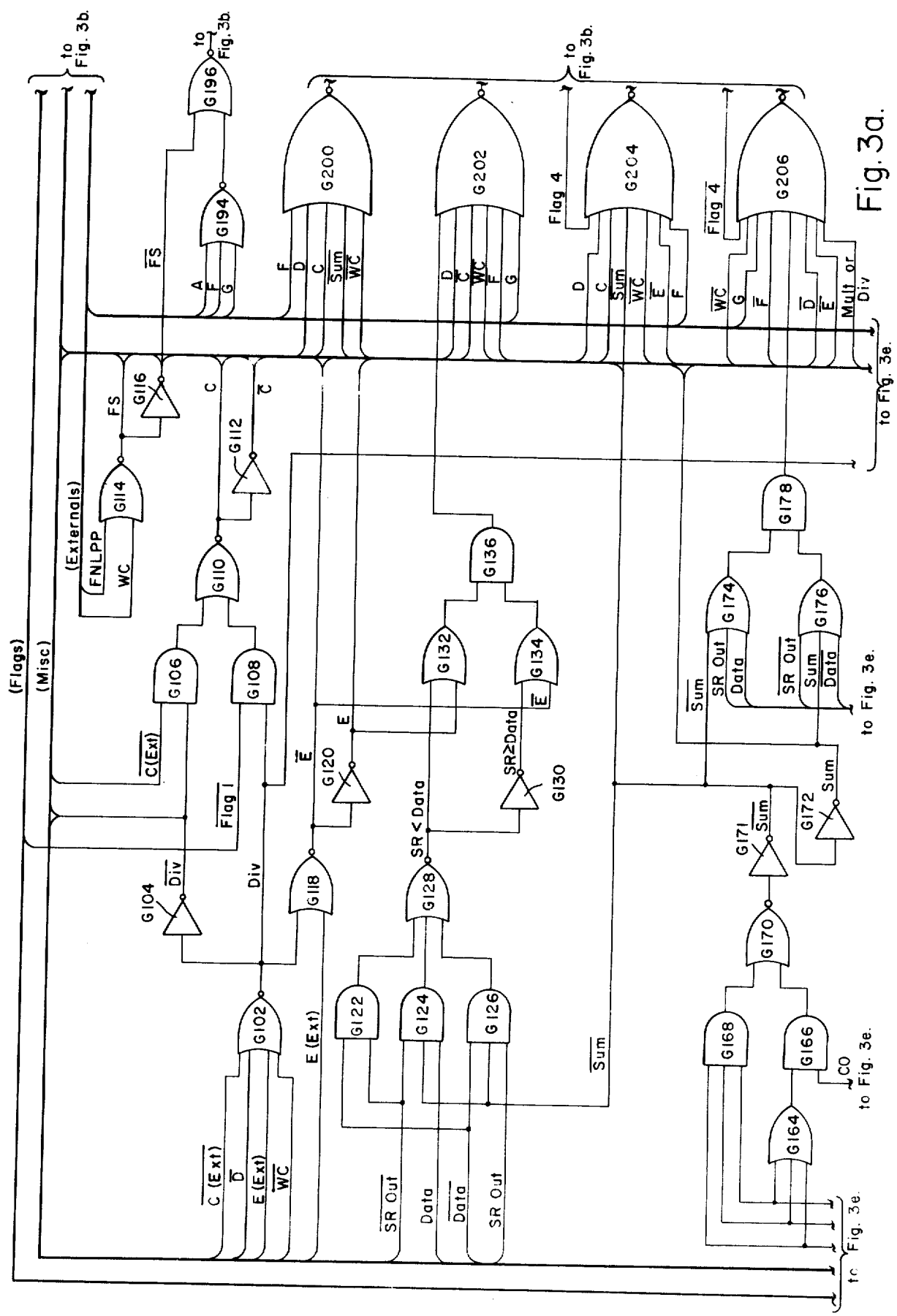
FIG. 3, comprising FIGS. 3a through 3h (which are to be combined into a single large figure), presents a detailed logic diagram for an individual processing cell for performing the functions delineated in FIG. 2 and the associated functional description.
Figure 3B:
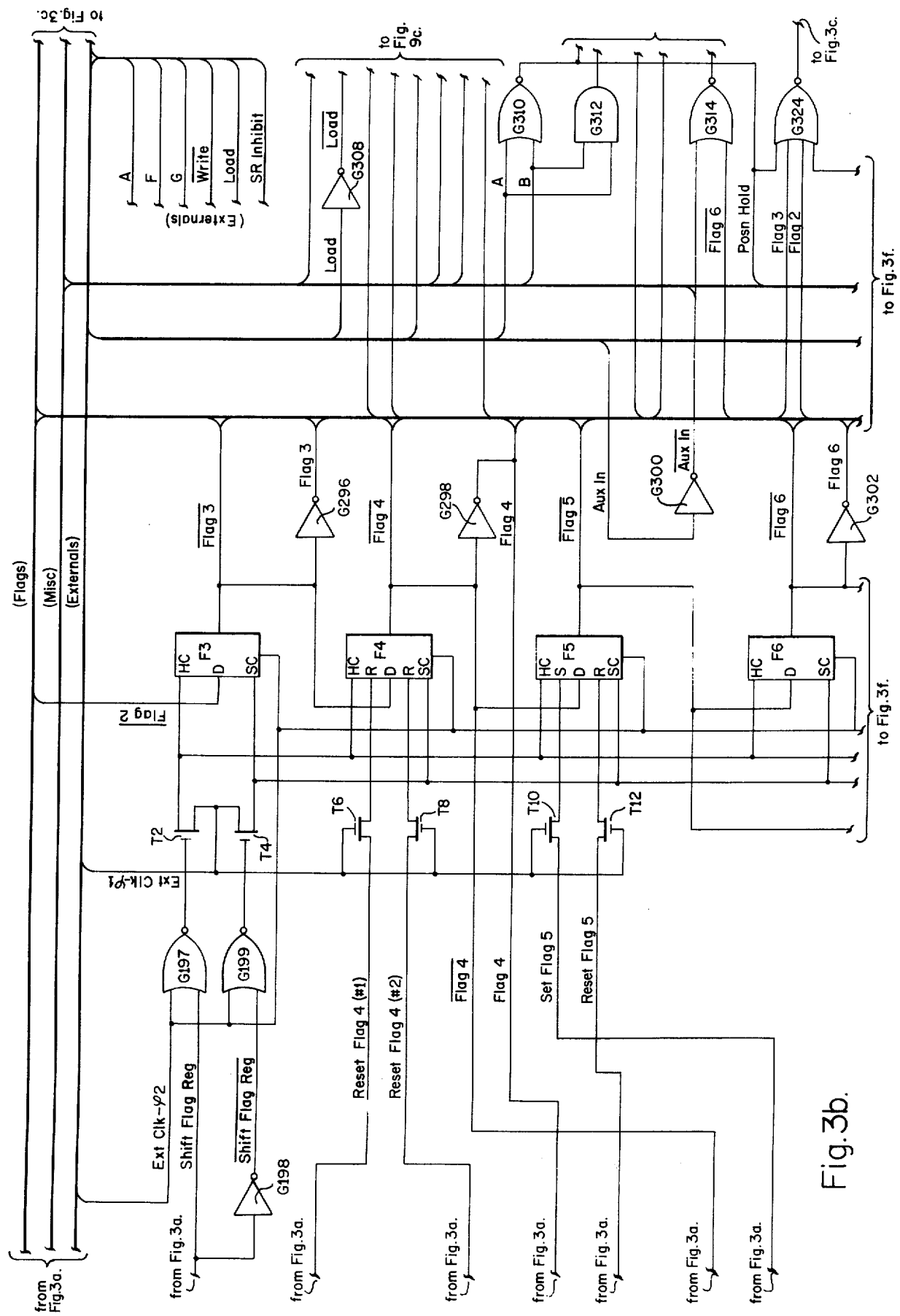
Figure 3C:
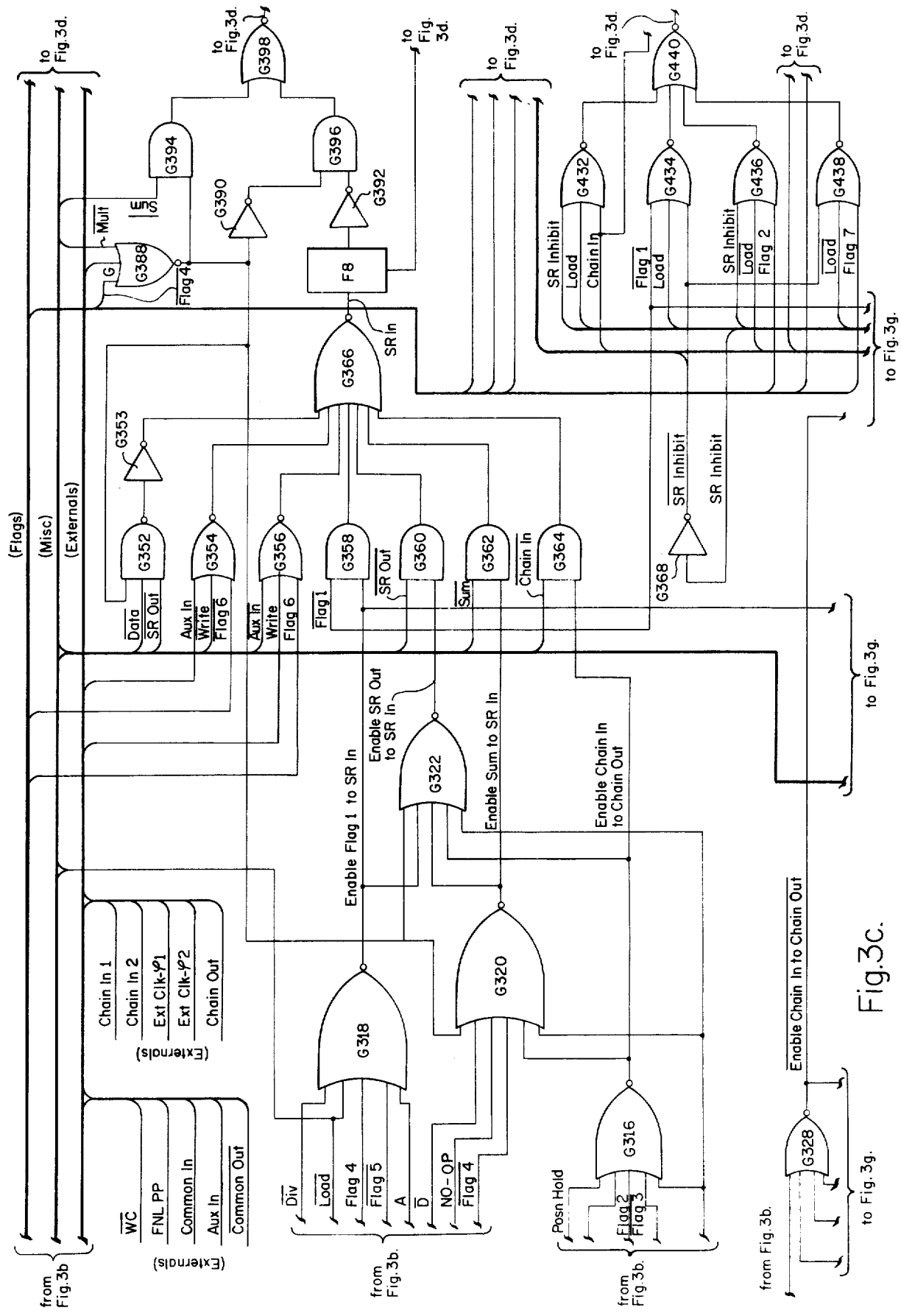
Figure 3E:
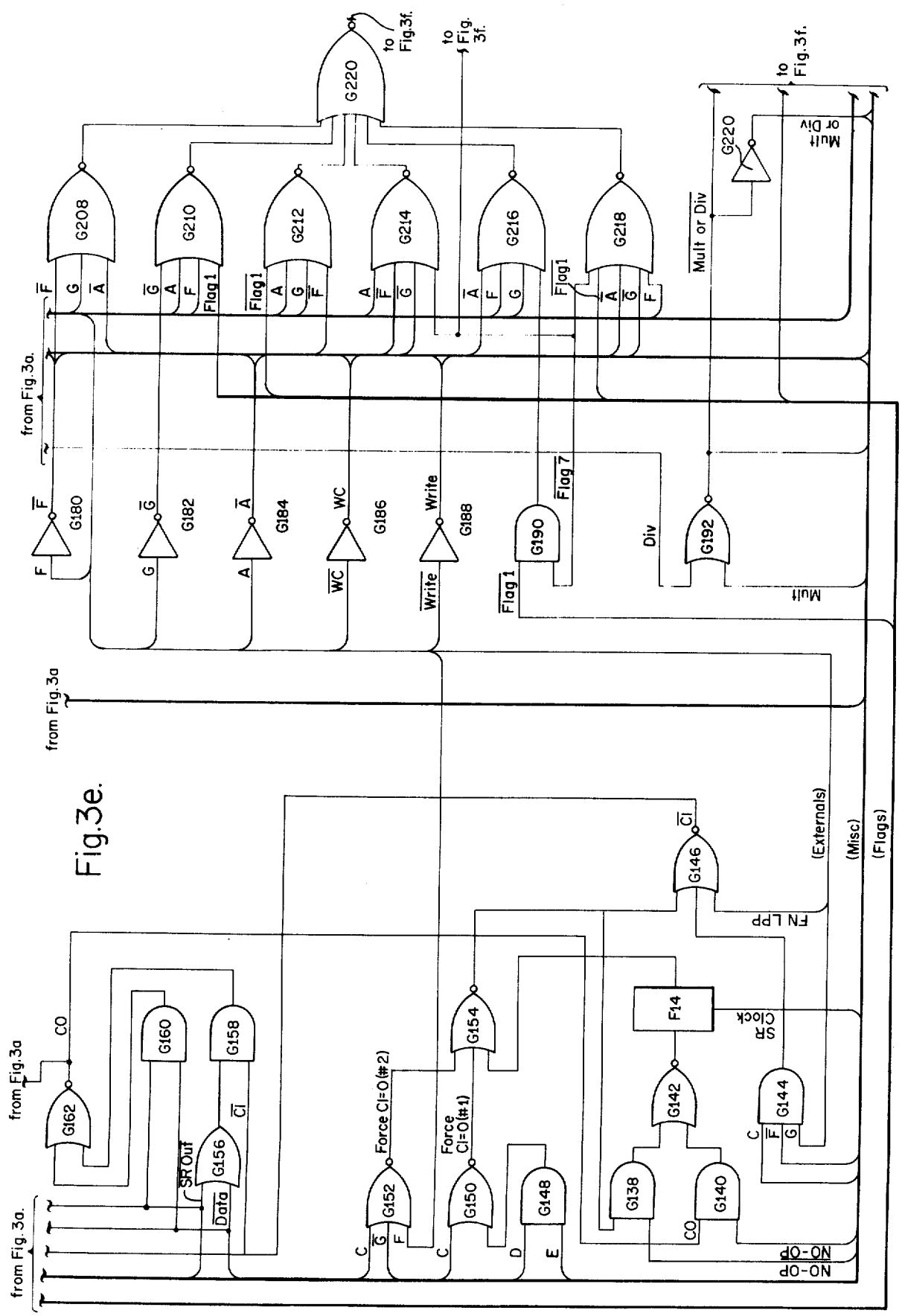
Figure 3F:
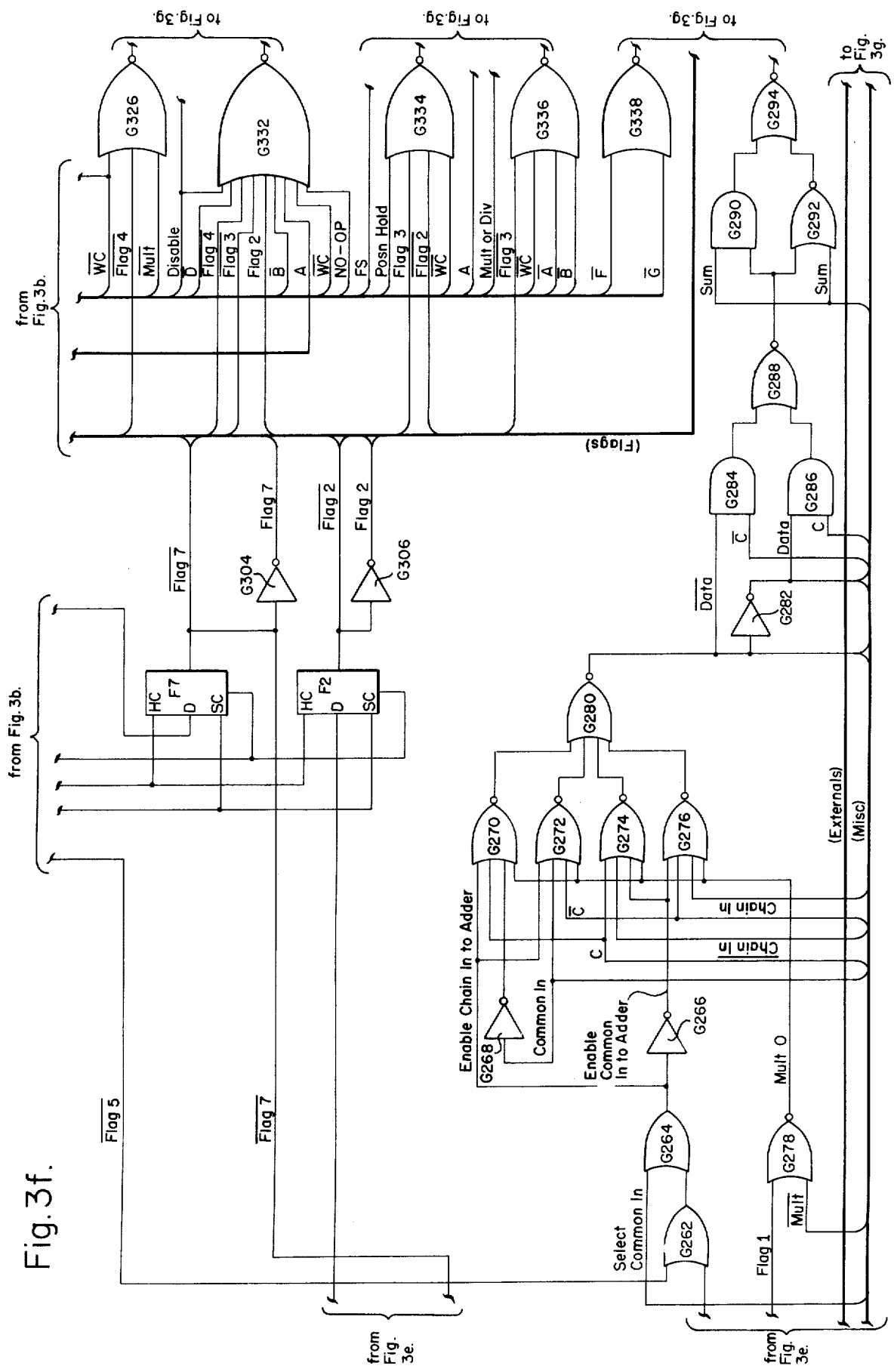
Figure 3G:
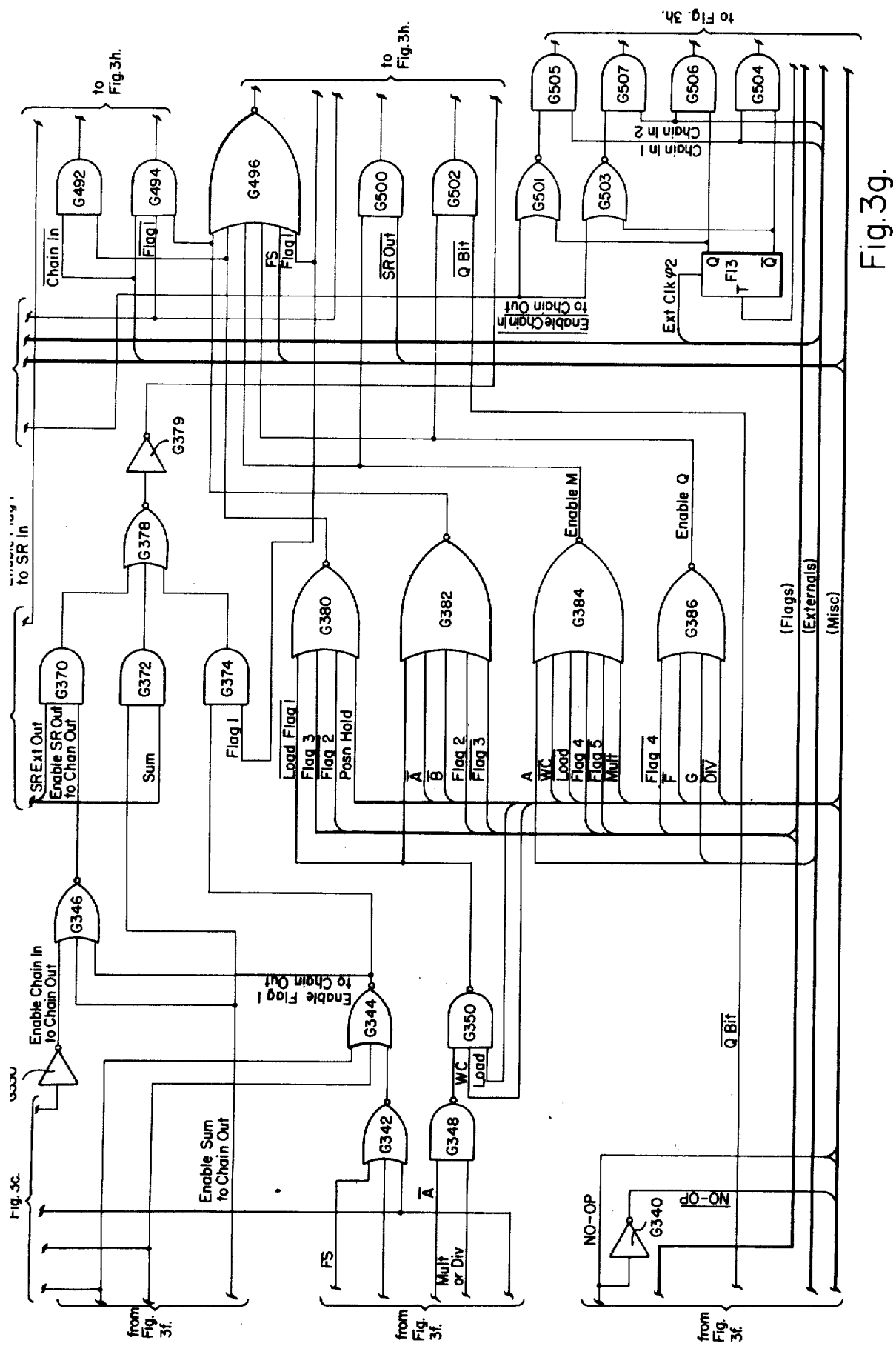

FIGS. 2a and 2b taken together illustrate possible data flow paths within an individual cell. It should be noted that the various Flags and processing and other logic blocks in these figures are duplicated on each figure but that the data paths indicated are different. This has been done in the interest of clarity and is particularly relevant to a thorough understanding of the present invention, inasmuch as the processor has two basic modes of operation - a "Word Cycle" mode and a "Flag Shift" mode. Data flow within the Word Cycle mode is illustrated in FIG. 2a, and in this figure, a path used only in the Flag Shift mode is not indicated thereon, but rather, is indicated in FIG. 2b, wherein paths used only in the Word Cycle mode are not indicated. In the preferred embodiment disclosed, the processor is also provided with a "Fault Isolation" mode, but the data flow for that mode is relatively uncomplicated and, in any event, will become clear from the text and figures which follow.

Referring now to FIG. 2a wherein Word Cycle mode data flow is illustrated, it may be seen that the individual word processing cell 12 of FIG. 1 is provided with a Flag register 30 comprising a First or Head Flag 31 which is utilized in the transfer of data between cells and also may be used as a temporary store for data. Second Flag 32 and Third Flag 33 together are used in the generation of a local "Word State" control signal which may be different in different cells. It should be noted that "control signal" paths, as distinct from "data" paths, have not been illustrated in these FIGS. 2a and 2b, but may be found in FIG. 3. Fourth Flag 34 enables arithmetic operations. Fifth Flag 35 identifies arguments for Multiply, Divide, and Square Root operations. The Fourth and Fifth Flags may also function as temporary storage of the results of arithmetic and logical operations performed by the processing, such as Match, Approximate Match, and Arithmetic overflow. Sixth Flag 36 may enable Auxiliary Input data to the Shift Register, while Seventh Flag 37 may enable data to be output from that cell onto the Common Output channel. Each cell is also provided with Arithmetic Input Select logic 40 which, in response to local and global control signals, selects input data either from the Common Input 18a or from the Chaining Input 14a via Chain Input Select logic 42 which is responsive to the Fault Isolation logic 44 when the processor is in the Fault Isolation mode. Shift Register 46 is normally a 64-bit shift register, but, in the detailed logic which is discussed hereinafter with reference to FIG. 3, may effectively be modified to a 65- or 63-bit shift register configuration in order to perform left or right shifts (with respect to other cells) in division or multiplication, respectively. The input to this Shift Register is selected by Shift Register Input logic 48 which selects input from First Flag 31, from an Adder 50, from the Chaining Input via logic 42, and from Auxiliary Input 18b, depending on the setting of the Sixth Flag and also depending on the global control signals 16 and the local word state determined by Word State logic 51 (which, as has been noted, is in turn responsive to the states of the Second and Third Flags). In order to conserve the number of external control lines required, a few global controls may previously be input via Auxiliary Input 18b and Common Input 18a to a Word Cycle Control register 52 during a Flag Shift mode operation, and then the data stored in this register may be utilized as though it were a global control signal during the Word Cycle operation. This time-sharing is possible, inasmuch as Flag Shift mode requires fewer active control and input/output lines than does Word Cycle mode.

Miscellaneous logic 54 accepts data from logic 40, as well as Adder 50, and is utilized, for example, in Multiply and Divide operations, supplying its output to Flag 1 for output to a neighboring cell utilizing the cooperative Word nature of the processor. Flag 1 Input and Common Output Select logic 56 selects output data to be output on Common Output line 20 either from Chaining Input line 14a (via Select logic 42) or from Shift Register 46, while Chain Output logic 58 selects the data to be output on Chaining Output 14b from either the Adder 50, or the Chaining Input Select logic 42, or shift register 46.

Each cell is also provided with Flag 2 Input Select logic 60, which is utilized only in the Flag Shift mode. It should be emphasized that the present figure, as well as FIG. 2b which follows, does not illustrate the flow of global control signals from control lines 16, of word state signals output from Word State logic 50, or external control signals stored in register 52 to the various logic portions of the cell. This important aspect of the present invention is covered in detail below with reference to FIG. 3 illustrating the detailed logic diagram for a preferred embodiment of the present invention. That figure identifies all significant control signal paths, as well as providing in logic diagram form a preferred implementation for the various processing and control logic, as well as data storage functions.

Referring now with greater particularity to FIG. 2b wherein data flow in the Flag Shift mode is illustrated, it may be seen that Flag data is input to the First Flag 31 from either Chaining Input 14a (via Input Select logic 42), or from Flag 2, or from Flag 7, or from Flag 1 itself, as determined by Flag 1 Input and Common Output Select logic 56. In the particular embodiment disclosed in detail hereinafter, there is no way to prevent changing Flag 1 while in the Flag Shift mode, inasmuch as the contents of Flag 1 are inverted by logic 56, should they be selected as input.

Data is input to the remainder of Flag register 30 via second Flag 32. Flags 2 through 7 act as a shift register with the contents of Flag 2 being shifted to Flag 3 and so on down to the contents of Flag 6 being shifted to Flag 7. The input to this shift register is determined by the Flag 2 Input Select logic 60, which will select either Flag 1, or Flag 7, or a logical combination thereof, or a constant, depending on the state of the global control lines 16. Flag 2 Input Select logic 60 may also cause a no-shift condition for Flags 2 through 7. The output of this shift register (the contents of Flag 7) is lost, unless output logic 56 selects it as the input to Flag 1, or input logic 60 selects it as an input to Flag 7, in which case the Flag register performs as a 7-bit or 6-bit circular shift register, respectively.

Functional Description of the Various Modes

As has been noted above, the word-cooperative memory in its preferred embodiment disclosed herein can operate in three distinct modes: Word Cycle, Flag Shift, and Fault Isolation. Word Cycle is the primary operational mode of the memory and is used for performing the following arithmetic and logical operations on the memory cell data:

Exact Match
Approximate Match
Greater Than or Equal Match
Less Than Match
Exclusive-OR
Add
Subtract
Multiply
Divide
Square Root All of these operations except Square Root utilize two operands: the Shift Register 46 data in a given cell 10, and either the Shift Register data in another cell (via the Chaining channel 14) or the Common Input 18a data (which will result in one operand being common to all cells). Only one type of arithmetic or logical operation can be executed in the memory at any given time, and it is executed in parallel in all cells which are to participate in the operation. The function performed by any given cell in an arithmetic or logical operation (e.g., whether a cell is to execute an addition or is to supply data to another cell where an addition is being performed) is dependent upon the states of various Flag flip-flops of Flag register 30, in conjunction with the states of the global control lines 16 and register 52.

Flag Shift mode is used to change the states of the Flag flip-flops. The primary function of Flag Shift is to get the Flag flip-flops in the various cells set in the correct states for a subsequent Word Cycle operation. Memory operation thus frequently consists of alternating between Flag Shift and Word Cycle operations.

Fault Isolation mode is used for functionally disconnecting any cell in which a fault is detected. This mode is normally used only upon power turn-on, prior to the execution of operational programs.

1. Data and Control Lines

The various data control lines will now be discussed. In this regard, it should be noted that, although FIGS. 1 and 2 are simplified block diagrams wherein a plurality of discrete lines may have been indicated as a single bus, in the detailed logic diagram of FIG. 3 (to be described in detail hereinafter), each line has been individually shown as an input or output to the relevant gate flip-flop or shift register. An effort has been made to insure uniformity of labeling these lines, both in that detailed logic description and in the present functional description; Accordingly, a particular line and its associated control signal are indicated in capital letters with a bar over the name indicating that it is an inverted signal being utilized.

In the preferred embodiment disclosed, there are 13 discrete interconnect lines (exclusive of power) common to all cells. Eight of these lines form control bus 16 and are designated:
A
F
G
WRITE
LOAD
SR INHIBIT
WC
FNLPP There are three data lines, two for input and one for output, designated:
COMMON IN
AUX IN
COMMON OUT
which have been labeled in FIGS. 1 and 2 as numbers 18a, 18b, and 20 respectively. The two remaining global lines are a two-phase master clock, designated respectively EXT CLK-$\phi$1 and EXT CLK-$\phi$2.

The Chaining Channel requires three additional interconnects per cell in order to interconnect the cells. These lines are designated:
CHAIN IN 1
CHAIN IN 2
CHAIN OUT
the first two comprising Chaining Inputs 14a and 14a', while the latter bears the reference number 14b.

As noted above, the memory can operate in three distinct modes: Fault Isolation, Flag Shift, and Word Cycle. These modes are defined by the WC and FNLPP lines, as follows:

|  | WC | FNLPP |
|---|---|---|
| Fault Isolation | 0 | 1 |
| Flag Shift | 0 | 0 |
| Word Cycle | 1 | 0* |

*Note:
FNLPP = 1 at times during Multiply as described hereinafter.

2. Fault Isolation Mode

There are five possible control states, or operations in Fault Isolation mode. Four operations test for various flag conditions indicative of faults detected by test programs and disable the cell, if a fault is detected. The remaining operation changes the chaining input selection in the cell. Due to the small number of operations, each operation is commanded by a discrete control line (rather than encoding $2^n$ operations on $n$ control lines as is the case with Flag Shift and Word Cycle). The Shift Register 46 clock is inhibited during Fault Isolation. The four fault detection operations and the control lines used are as follows:

| Operation | Control Line |
|---|---|
| Set Disable F/F if Flag 1 = "1" | A |
| Set Disable F/F if Flag 1 = "0" | G |
| Set Disable F/F if data to common output = "1" | F |
| Set Disable F/F if Flag 4 = "1" | LOAD |

When the Disable flip-flop in fault isolation logic 14 is set, the Common Output is inhibited, the Chaining Output logic is forced to a relay condition (i.e., Chaining Input enabled to Chaining Output), and the clock drivers for all registers are inhibited. The Disable flip-flop is initially reset at power turn-on. Once the Disable flip-flop is set, it cannot be reset under program control; it can be reset only by turning power "off."

The Chaining Input 14a to each cell actually consists of two separate inputs from the Chaining Outputs of the two preceding cells on the chaining channel. These inputs are designated CHAIN IN 1 and CHAIN IN 2, with CHAIN IN 1 connected to the Chaining Output of the adjacent preceding cell and CHAIN IN 2 connected to the second preceding cell. Each cell has Chain Input Select logic to select one or the other input. It is thus possible to bypass a malfunctioning cell by selecting CHAIN IN 2 in the next.

The Chaining Input selection is changed by the WRITE line, in conjunction with Flag 1. The Chain Input Select logic comprises a toggle flip-flop. On power turn-on the flip-flop is reset, enabling CHAIN IN 1. Each clock time that WRITE is active and Flag 1 is set, the flip-flop toggles. With the flip-flop set, CHAIN IN 2 is enabled. If the flip-flop is toggled twice, CHAIN IN 1 is again enabled. The chaining input selection cannot be changed, if the Disable flip-flop in fault isolation logic 44 is set.

3. Flag Shift Mode

In Flag Shift mode, three types of operations occur simultaneously: loading Flag 1, loading Flag 2 and shifting Flags 2 through 7, and loading the control register.

In addition, the Shift Register clock is inhibited and the input to Flag 1 is enabled to the chaining output.

There are four possible inputs to Flag 1, based on the LOAD and SR INHIBIT lines, as follows:

| Input to Flag 1 | LOAD | SR INHIBIT |
|---|---|---|
| Chaining input | 0 | 0 |
| Flag 1 | 0 | 1 |
| Flag 2 | 1 | 0 |
| Flag 7 | 1 | 1 |

It should be noted that there is no way to prevent changing Flag 1 while in Flag Shift. If it is desired to retain information as to its previous state, the program must select the Flag 1 input plus keep track of whether there have been an odd or even number of clock times. The selected input to Flag 1 is also enabled to COMMON OUT.

There are seven possible inputs to Flag 2 plus a no-change condition, based on lines A, F, and G, as follows:

| Input to Flag 2 | A | F | G |
|---|---|---|---|
| No change | 0 | 0 | 0 |
| Flag 1 | 0 | 0 | 1 |
| Flag 1 | 0 | 1 | 0 |
| Flag 7 | 0 | 1 | 1 |
| Flag 1 OR Flag 7 | 1 | 0 | 0 |
| Flag 1 AND Flag 7 | 1 | 0 | 1 |
| Set to "1" | 1 | 1 | 0 |
| Reset to "0" | 1 | 1 | 1 |

Under any condition other than the no-change condition, Flags 2 through 7 operate as a shift register; i.e., current state of Flag 2 goes to Flag 3, current state of Flag 7 is lost (unless specifically enabled to Flag 1 or Flag 2).

4. Word Cycle Mode

Word Cycle operations require more control lines than Fault Isolation or Flag Shift operations, although not all of these control lines need to change state during an operation. As a result, eight control lines required for Word Cycle are stored in the Word Cycle Control register 52. If these lines were not stored in the cell, eight additional interconnect lines would be required. Since normal operation of the memory will consist of alternating between Flag Shift and Word Cycle modes, the control register is loaded during Flag Shift mode. In order to minimize the number of clock times for loading, the register 52 consists of two 4-bit shift registers. One shift register accepts data from the COMMON IN line 18a, and the other from AUX IN 18b. Input to the Word Cycle Control register clock is enabled by the WRITE line; if more than four clock times are required for the desired flag shifting operations, WRITE should be enabled for only four clock times. The data input is as follows:

| Input Line | Clock Time | Resultant Control Line |
|---|---|---|
| COMMON IN | 1 | MULT |
|  | 2 | INHIBIT SR SELECT |
|  | 3 | OUTPUT SR |
|  | 4 | SELECT COMMON IN |
| AUX IN | 1 | E (EXT) |
|  | 2 | D |
|  | 3 | $\overline{C}$ (EXT) |
|  | 4 | B |

It should be noted that the Word Cycle Control registers 52 in all cells are loaded simultaneously. It is thus not possible to load some of these registers with different data than others.

The operation performed during Word Cycle is dependent upon both the external control lines and these resultant control lines stored in the cell. The Word Cycle logic, however, does not distinguish between external and stored control lines.

Detailed Functional Description of the Individual Cell

1. Data Routing

In Word Cycle Mode, the routing of data within and between cells is dependent upon both the globally controlled sub-mode and the states of Flags 2 and 3 in the individual cells. The sub-modes are designated Position Hold, Word Chain, and Flag Transfer. The states of Flags 2 and 3 define the word state of the cell, as follows:

| Word State | Flag 3 | Flag 2 |
|---|---|---|
| 0 | 0 | 0 |
| 1 | 0 | 1 |
| 2 | 1 | 0 |
| 3 | 1 | 1 |

The particular Word Cycle sub-mode is determined by lines A and B, as follows:

| Sub-mode | A | B |
|---|---|---|
| Position Hold | 0 | 0 |
| Word Chain | 0 | 1 |
| Flag Transfer | 1 | 1 |

Table 1 specifies cell operation based on the sub-mode and word state, using the following notation:
SR In — input to Shift Register
SR Out — Shift Register output
Chain In — input from Chaining channel
Chain Out — output to Chaining channel
S — Sum output of Adder
SR Out/S — indicates either Shift Register or Sum data is used, depending upon the operation being executed; if Add, Subtract, Multiply, Divide, or Exclusive-OR is being commanded, Flag 4 is set in the subject cell, and the current bit is a numeric bit, the sum is used, otherwise SR Out.

TABLE 1

| SUB-MODE | WORD STATE | SR IN | INPUT TO CHAIN OUT | FLAG 1* |
|---|---|---|---|---|
| Position Hold | All | SR Out/S | SR Out |  |
| Word Chain | 0 Relay | SR Out/S | Chain In |  |
|  | 1 Clocked Relay | SR Out/S | Flag 1 | Chain In |
|  | 2 Chain | Chain In | SR Out/S |  |
|  | 3 Recirculate | SR Out/S | SR Out |  |
| Flag Transfer | 0 Relay | SR Out/S | Chain In |  |
|  | 1 Clocked Relay | SR Out/S | Flag 1 | Chain In |

TABLE 1-continued

| SUB-MODE | WORD STATE | SR IN | INPUT TO CHAIN OUT | FLAG 1* |
|---|---|---|---|---|
| | 2 Flag Spread | SR Out/S | Chain In OR Flag 1 | Chain In OR Flag 1 |
| | 3 ORed Relay | SR Out/S | Chain In OR Flag 1 | |

*No entry indicates Flag 1 does not change. Even if an input is indicated, Flag 1 does not change state unless the LOAD line is active.

It should be noted that the sub-mode never needs to change state during a Word Cycle operation, and neither A nor B, therefore, need to be external control lines. The reason for nevertheless making line A external is that, in performing multiplication or division, it is necessary to switch from Word Chain to Flag Transfer sub-mode and back to Word Chain after each partial product or partial remainder formation. By using an external control line, this change can be made without changing to Flag Shift and loading the control register 52 each time.

The arithmetic or logical operation to be performed is determined by C, D, and E, as follows:

| Operation | C | D | E |
|---|---|---|---|
| Match | 0 | 0 | 0 |
| Approximate Match | 0 | 0 | 1 |
| Exclusive-OR | 0 | 1 | 0 |
| Add | 0 | 1 | 1 |
| Less Than | 1 | 0 | 0 |
| Greater Than or Equal | 1 | 0 | 1 |
| Subtract | 1 | 1 | 1 |

C and E are equal to C(EXT) and E(Ext) unless Divide is indicated, in accordance with the following:

| Is Divide Indicated? | C | | E |
|---|---|---|---|
| No | C (EXT) | | E (EXT) |
| Yes | Flag 1 | | 1 |
| Divide is indicated as follows: | | | |
| Divide | $\frac{C(EXT)}{1}$ | $\frac{D}{1}$ | $\frac{E(EXT)}{0}$ |

The reason for having C(EXT) and E(EXT) is that the implementation of division is simplified. By forcing E to a "1", Divide creates an indication of either Add or Subtract, depending upon the state of Flag 1. In division, Flag 1 represents the current quotient bit. For the non-restoring division algorithm, the divisor is either subtracted from or added to the partial remainder, depending upon whether the current quotient bit is a "1" or "0."

Control lines F and G determine how each data bit is to be interpreted during an arithmetic or logical operation, as follows:

| Interpretation | F | G |
|---|---|---|
| Middle numeric bit (M) | 0 | 0 |
| First numeric bit (F) | 0 | 1 |
| Last numeric bit (L) | 1 | 0 |
| No-op bit (N) | 1 | 1 | where "first" indicates first bit processed (l.s.b.) and "last" indicates last bit processed (sign). For Match, Approximate Match, and Exclusive-OR only F is used, as follows:

| Interpretation | F | G |
|---|---|---|
| Numeric bit | 0 | X |
| No-op bit | 1 | X |
| Note: X = "don't care" | | |

The term "numeric bit" is used to indicate bit positions in which the commanded operation is to be executed; in No-op positions, the operation is inhibited.

One of the major advantages of bit-serial arithmetic is that it can be made very flexible. Maximum flexibility is a major objective of the field control logic. Logic fields (Match, Approximate Match, Exclusive-OR, and No-op) can be any length from one bit to many consecutive words. Fields for short arithmetic operations (Greater Than or Equal Match, Less Than Match, Add, and Subtract) can be any length from two bits (first numeric and last numeric) to many consecutive words. Single short arithmetic fields may even contain No-op fields. For example, One Word Adjacent Word [LFLMM] → [NNMMNFNN]

defines two valid arithmetic fields, LF (2 bits) and LMMMMF (6 bits with word boundary and two (2 bit and 1 bit) internal No-op fields. No-op fields (containing tag bits) will often be used with multiword arithmetic fields so that these words can be distinguished from other words during associative search operations.

The fields for long operations (Multiply, Divide, and Square Root) are more restricted. They can range in length from 2 bits to one full word, but each entire field must be completely contained within a physical word. Moreover, these fields must not contain any No-op bits.

2. Intra-Cell Control Lines

The SELECT COMMON IN signal is generated by Arithmetic Input Select logic 40 and is used to select the data to be used as the operand in arithmetic and logical operations. If this line equals "1", COMMON IN data is used; if the line equals "0", Chaining Input data from Chain Input Selection logic 42 is selected. The exception to this operation is that a cell can force the selection of COMMON IN data during multiplication and division, as described below.

The SR INHIBIT and INHIBIT SR SELECT lines are used to inhibit the Shift Register clock. SR INHIBIT, being an external line, is used to dynamically inhibit Shift Register clocks. INHIBIT SR SELECT determines which cells are to be affected when SR INHIBIT is a "1". If INHIBIT SR SELECT equals "1", the Shift Register clock is inhibited in cells in Word State 1 or 3; with INHIBIT SR SELECT equal to a "0", the clock is inhibited in cells in Word State 0 or 2.

The OUTPUT SR line selects the data enabled to COMMON OUT. If OUTPUT SR = "1", the Shift Register 46 data is enabled; if the line is at "0", the Chaining Input data is enabled. Regardless of the state of OUTPUT SR, COMMON OUT is enabled only if Flag 7 = "1" in the cell. The COMMON OUT"s of all cells are wire-ORed together.

The LOAD line is normally used for loading Flag 1. Unless multiplication or division is indicated, each clock time that LOAD = "1", Flag 1 is loaded with the data indicated by the sub-mode and the Word State of the cell (as defined in Table 1). During multiplication and division, LOAD performs a different function and is inhibited from changing Flag 1; this is discussed below in the Multiply and Divide descriptions below.

The MULT line is used to designate Multiply. Consideration in the development of this preferred embodiment was given to eliminating the Match operation--which is not completely necessary since there is also an Approximate Match function--and instead encode Multiply on C, D, and E. However, for 2's complement multiplication, it is necessary for the final partial product formation (based on the sign bit of the multiplier) to be a subtraction. With a separate MULT line, the external control on C, D, and E can indicate Add for all but the last partial product, then Subtract. If Multiply was encoded on C, D, and E, then an additional line would still be required to indicate the final partial product.

3. Auxiliary Input Line

The auxiliary input 18b allows external data to be entered into a cell via Shift Register Input logic 48. Logical OR and AND functions can be performed between the external data and the data which would otherwise be enabled to the Shift Register. It is also possible to perform various operations involving Flag 6. The truth table below defines the Auxiliary Input operations:

| Flag 6 | WRITE | AUX IN | SR IN | |
|---|---|---|---|---|
| 0 | 0 | 0 | D | D = Data selected |
| 0 | 0 | 1 | 0 | by Sub-Mode and |
| 0 | 1 | 0 | D | Word State (SR |
| 0 | 1 | 1 | D | Out, Sum, or |
| 1 | 0 | 0 | D | Chain In) |
| 1 | 0 | 1 | 1 | |
| 1 | 1 | 0 | 0 | |
| 1 | 1 | 1 | 1 | |

The various input operations which can be performed and the required control line states are given below:

| SR In | Flag 6 | WRITE | AUX IN | |
|---|---|---|---|---|
| D | 0 | X | 0 | X = Don't care |
| D | X | 0 | 0 | |
| D | 0 | 1 | X | 1 = Input data |
| Ext. Data | 1 | 1 | 1 | (either Ext. |
| Ext. Data OR D | 1 | 1 | 1 | Data or Flag 6) |
| Ext. Data AND D | 1 | 1 | 0 | |
| Flag 6 | 1 | 0 | 1 | |
| Flag 6 OR D | 1 | 1 | 1 | |
| Flag 6 AND D | 1 | 1 | 0 | |

4. Arithmetic and Logical Operations

In the functional description of arithmetic and logical operations which follows, the term "input data" means either Chaining or Common Input data, whichever is selected. These operations are only functional during bit times in which the No-op bit condition is not indicated. During No-op bit times, no Flags can be reset, and the Sum output of the Adder is not used. All of these operations, except Multiply and Divide, can be performed on either continuous or broken fields occuring in one or more physical words.

a. Match

Flag 4 is reset "0" every clock time in which the Shift register Bit is not the same as the input data bit. The mismatch condition is detected by using the Sum output of the Adder with the Carry input forced to "0".

b. Approximate Match

Flag 4 is reset under the same conditions as for Match. In addition, a mismatch occurring with Flag 4 reset resets Flag 5.

c. Greater Than or Equal

The input data is subtracted from the Shift Register data, and a test is made on the input and Shift Register data bits and Sum output at the sign bit position (as indicated by a last numeric bit indication), as follows:

| SR | Input | Sum | SR | Input |
|---|---|---|---|---|
| 0 | 0 | 0 | | 1 |
| 0 | 0 | 1 | | 0 |
| 0 | 1 | 0 | | 1 |
| 0 | 1 | 1 | | 1 |
| 1 | 0 | 0 | | 0 |
| 1 | 0 | 1 | | 0 |
| 1 | 1 | 0 | | 1 |
| 1 | 1 | 1 | | 0 |

Flag 4 is reset if SR ≥ Input = "0" on the last numeric bit. Shift register data is not changed by this operation.

d. Less Than

This operation is identical to Greater-Than or Equal, except that Flag 4 is reset by SR ≥ Input = "1".

e. Exclusive-OR

This function is generated by using the Sum output of the Adder with the Carry input forced to "0".

f. Add

This function is generated by the Adder. The Carry input is forced to "0" on the first numeric bit. A Carry flip-flop stores the carry output each numeric bit time. If a No-op field occurs within a numeric field, the Carry flip-flop does not change state and thus maintains the Carry generated on the numeric bit occurring immediately prior to the No-op bits. Flag 5 is set on the last numeric bit time, if overflow is detected.

g. Subtract

Subtraction is performed in the same manner as addition, except that the inverse of the input data is enabled to the adder, and the Carry input is forced to a "1" on the first numeric bit. Two's complement arithmetic is thus effected.

h. Multiply and Divide

Multiplication and division require alternating between Word Chain and Flag Transfer sub-mode operations for each partial product/partial remainder generation. The partial product/partial remainder itself is formed using Word Chain, then the next mutliplier/quotient bit is transferred from Flag 1 of the multiplier/partial remainder word to Flag 1 of the partial product/quotient word using Flag Transfer. In order to eliminate unnecessary changing of Flag flip-flops, the same word state is used for both operations. Word states for the various operands are specified in Table 2. Operands are identified by the states of Flags 4 and 5, as follows:

|  | Flag 4 | Flag 5 |
|---|---|---|
| Multiplier/quotient | 0 | 1 |
| Partial product/partial remainder | 1 | * |
| Multiplicand/divisor and non-operand words | 0 | 0 |

*If Flag 5 = 1, the cell is forced to accept the Common Input data as the multiplicand/divisor; if Flag 5 = 0, the normal global control for selecting Common or Chaining channel data is used.

h1. Multiply

Multiplication is accomplished by using a triplet of physical words consisting of multiplier, multiplicand, and partial product. These words must be ordered on the Chaining channel in the order indicated, although they need not be adjacent (i.e., there may be "relay" words between operand words). This is diagrammed as follows (arrows indicate direction of data flow on the chaining channel):

Multiplier #1 → Relay → Multiplicand #1 → Relay → Partial Product #1 → Relay → Multiplier #2 → etc.

The multiplicand may be eliminated from the triplet by supplying it on the Common Input. It is also possible to have one multiplier word operate on any number of multiplicands. This is accomplished by organizing the operand words on the Chaining channel as follows:

Multiplier A → Multiplicand A1 → Partial Product A1 → Multiplicand A2 → Partial Product A2 → . . . → Multiplicand AN → Partial Product AN → Multiplier B → Multiplicand B1 → Partial Product B1 → . . . → Multiplicand BM → Partial Product BM → Multiplier C → etc.

TABLE 2

| OPERAND | WORD STATE | PARTIAL PRODUCT/PARTIAL REMAINDER FORMATION (WORD CHAIN) | MULTIPLIER/QUOTIENT BIT TRANSFER (FLAG TRANSFER) |
|---|---|---|---|
| Multiplier | 1 | SR Out to SR In (i.e., recirculate) | Flag 1 to Chain Out; Chain In to Flag 1 |
| Multiplicand | 3 | SR Out to Chain Out; SR Out to SR In | Chain In OR Flag 1 to Chain Out |
| Partial Product | 1 | S to SR In | Chain In to Flag 1; Chain In to Chain Out |
| Divisor | 3 | SR Out to Chain Out; SR Out to SR In | Chain In OR Flag 1 to Chain Out |
| Partial Remainder | 3 | S to SR In | Chain In OR Flag 1 to Chain Out |
| Quotient | 1 | SR Out to SR In | Chain In to Flag 1; Flag 1 to Chain Out |
| Non-operand words | 0 | Chain In to Chain Out; SR Out to SR In | Chain In to Chain Out |

Notes:
1. When in Word Chain, LOAD must be inhibited, except when transferring a multiplier bit from, or a quotient bit to the shift register.
2. When in Flag Transfer, LOAD must be active.
3. Flag 1 must be 0 in multiplicand and divisor; Flag 1 in quotient is automatically reset each word cycle.
4. Multiplication and division are grouped together here for convenience; however they cannot be executed concurrently.

This operation is effected by forcing the partial product words to a partial relay condition when multiplication is being executed. This condition allows a multiplier bit to propagate down the Chaining channel (when in Flag Transfer), through multiple partial products, until it reaches the next multiplier word, in addition to enabling the Chaining channel data to Flag 1 in the partial product words.

The sequence of operation is that a multiplier bit is transferred to Flag 1 of the multiplier word in the course of recirculating the Shift Register each Word Cycle. This is accomplished by causing the LOAD line to go active for the bit time during which the next multiplier bit is at the output of the Shift Register. This is the only use of LOAD during multiplication. At the end of the Word Cycle, line A must change state to switch from Word Chain to Flag Transfer, thus loading the multiplier bit into Flag 1 of the partial product word, and then return to Word Chain. During multiplication, Add is indicated on lines C, D, and E, but the logic makes the addition conditional on Flag 1 = "1" of the partial product word.

The Shift Register 46 operation is also changed in the partial product so that the numeric field is effectively shifted right one bit during each partial product formation. This is accomplished by writing the sum bit into the second MSB of the Shift Register during each numeric bit time except the first. In this way, whatever is written into the MSB during any numeric bit time, except for the last, is lost because it is not transferred to the next bit in the Shift Register.

The last numeric bit written into the MSB of the Shift Register represents the sign bit of the current partial product. This bit should be the same as the sign bit of the multiplicand, except that it should remain a "0" during all initial partial products with "0" multiplier bits prior to the first "1" multiplier bit. This is accomplished by ORing together the output of the Shift Register (which must be zeroed prior to executing multiplication) and the multiplicand input to the Adder (which is forced to "0" whenever the current multiplier bit is "0").

The following algorithm summarizes shift register operation for multiplication:

| | | |
|---|---|---|
| No-op bits | SR64 → SR63, | SR1 → SR64 |
| First numeric bit | SR64 → SR63, | S → SR64 |
| Middle numeric bits | S → SR63, | D' + SR1 → SR64* |
| Last numeric bit | S → SR63, | D' + SR1 → SR64 |

Symbols are defined as follows:
- SR1 LSB of Shift Register
- SR63 Second MSB of Shift Register
- SR64 MSB of Shift Register
- S Sum output of Adder
- D' Multiplicand data to Adder (forced to "0" if current multiplier bit is "0")
- * Input to SR64 for middle numeric bits is irrelevant since this data is lost; this input was chosen solely for ease of implementation.

In order to correctly round off the product, line FNLPP must be a "1" for the first numeric bit time of the next to the last partial product formation; this forces the carry input to a "1", thus adding one to the MSB of the portion of the product which is truncated.

Prior to the final partial product formation, a Flag Shift mode operation must be executed to change the control register to indicate Subtract rather than Add and to reset the Mult bit. It is also necessary to shift Flag 1 to Flag 4 in partial product words. Th final product is then formed by a Word Cycle iteration in which the multiplicand is subtracted from the partial product if Flag 4 (which represents the sign bit of the multiplier) is set. It should be noted that there is no right shift on the final product formation.

h2. Divide

Division is accomplished in a manner analogous to multiplication. The triplet of operands consists of (in order along the Chaining channel) divisor, dividend, partial remainder, and quotient. The divisor may also be supplied on the Common Input. Division is implemented using the "non-restoring" algorithm. With this algorithm, the initial (i.e., the sign) bit of the quotient is generated by comparing the signs of the divisor and dividend; if the signs are the same, the quotient sign is a "0". In generating the first numeric quotient bit, the divisor is substracted from or added to the dividend to form a partial remainder, dependent upon whether the quotient is an "0" or a "1" respectively. Successive quotient bits are generated by adding the divisor to, or subtracting it from, the partial remainder, dependent upon whether the previous quotient bit is an "0" or a "1", respectively. The new quotient bit is generated by comparing the sign bits of the divisor and the new partial remainder; like signs result in a "1" quotient bit. Prior to each partial remainder formation, however, the previous partial remainder must be effectively shifted left one bit position.

The initial quotient bit is formed by performing a Match operation on the sign bits of the divisor and dividend. The state of Flag 4 is then transferred to Flag 1, and Flag 1 is inverted, using Flag Shift operations. Flag 1 of the dividend/partial remainder word represents the quotient bit, except for the first cycle when it is the inverse of the quotient bit.

Following any additional Flag Shift operations required to set Flags 2 through 5 in the correct states (as defined by Table 2) and to change the control register indicator from Match to Divide, the mode is changed to Word Cycle. In a sequence similar to multiplication, the quotient bit is transferred from Flag 1 of the partial remainder word to Flag 1 of the quotient word prior to each partial remainder formation. This is accomplished by using line A to switch between Word Chain and Flag Transfer sub-modes. It should be noted that Flag 1 of the partial remainder does not change state while in Flag Transfer, as it is needed for the next partial remainder formation. Flag 1 controls the addition/subtraction decision by the logic enabling Flag 1 to control line C when Divide is indicated; as described above C = "1" for subtraction.

The effective right shift of the partial remainder (relative to the data stored in other cells) is implemented by the addition of an extra flip-flop at the right (least significant) end of the Data Shift Register. The output of this flip-flop is then used as the Shift Register data to the Adder, as follows:

| | | |
|---|---|---|
| No-op bit times | SR1 → SR64 | "0" → SR0 |
| All numeric bit times | S → SR64 | SR1 → SR0  SR0 → adder |
| Last numeric bit time | $\overline{D \oplus S}$ → Flag 1 | |

The symbols above are the same as used in the description of multiplication, with the addition of SR0 (the added flip-flop) and D (the divisor data).

In the course of each partial remainder formation, the current quotient bit is loaded into the quotient shift register. Since quotient bits are generated in reverse order (i.e., MSB first), the external control must keep track of the proper time to load the quotient bit. Each time that the current bit position corresponds to the significance of the current quotient bit, the state of Flag 1 is loaded into the shift register by activating the LOAD line. For example, during the first partial product formation following the initial Match operation, the current quotient bit is the MSB of the quotient; LOAD thus goes active during the last numeric bit time. LOAD also resets Flag 1 in the quotient word; this is necessary in order for the quotient bit to be properly transferred in Flag Transfer.

It should be noted that the shift register clock is inhibited when the processor is Flag Transfer sub-mode, if either Multiply or Divide is indicated. In this way the multiplier/quotient bit can be loaded into Flag 1 of the partial product/quotient word without the data being shifted. It should be noted that if the multiplier/partial remainder word is a "long" way along the chaining channel from the partial product/quotient word, a number of clock times can be allowed for the bit to propagate. In this case, the LOAD line should be a "0" until the clock time when the bit will have finished propagating, at which time LOAD is made a "1", thus loading the bit into Flag 1 at the partial product/quotient.

i. Square Root

Square Root is accomplished in a manner analogous to divide. Pairs of active words consist of respectively (in order along the Chaining channel) root and argument. Square Root is implemented using a so-called "non-restoring" algorithm. Initially each pair contains an argument (which must be positive) and an initial trial divisor ($0.01_2$) stored in the root word. The root (trial divisor) is subtracted from the argument so that the sign of the argument determines the first bit of the final root; if +, 1; if −, 0. The new root bit and two trial divisor bits are combined in the root word to form a new trial divisor. If +, the new trial divisor is $0.101_2$; and if −, $0.011_2$. The argument is then shifted one place left. If the argument was +, the root is subtracted; if −, added. The new argument sign determines the next root bit. Again the trial divisor in the root word is updated with new bits. If argument +, the root becomes $0.X[101]_2$; if −, $0.x[011]_2$. The shift, add or subtract, and update root sequence is repeated. For each repetition the bracketed portion of root bits being modified is moved one bit position to the left. One more root bit has reached its final value. Repetition is continued until all of the root bits have been evaluated. The evaluation is for the positive square root.

The most convenient way to compute square root is to redefine numerical fields to allow one extra bit (set to 0) on the left (sign bit) for both argument and root fields only during square root calculation. In this case it is convenient to assume that the position of the binary point is not changed by the expanded fields. For example, the initial expanded root field can be represented as $00.0100...0_2$ (+ 1/4), Note the two 0's before the binary point only one of which is the active sign bit.

Initial processing starts by using a Subtract Word Cycle operation to subtract the root from the argument. A Match operation is then used to interrogate the sign of the new argument. If +, the root is set to $00.[101]00...0_2$; if −, the root is set to $00.[011]00...0_2$. Flag 1 of the argument word is set to the inverse of the sign of the argument. A step divide Word Cycle operation is used next. The root word is set to a special Word State which combines the properties of divisor and quotient words (F1=0, F2=1, F3=1, F4=0, F5=1), and the argument word is set to dividend partial remainder state (F2=1, F3=1, F4=1, F5=0). Other memory words are kept in relay state (F2=0, F3=0, F4=0, F5=0). This operation shifts the argument left (requiring extra bit position to left), adds or subtracts the root, and uses the new sign of the argument to again set Flag 1 in the argument word. In addition to selecting between add or subtract for the next step divide, Flag 1 is used to control bit insertion during the next Word Cycle. Simultaneously, in the root word the bit to the right of the last final root bit (the left bit of the three root bits to be modified during the next Word Cycle operation) is forced to 0 by a command consisting of a 1 on the LOAD line. All three bits to be modified are then in known states (010) at the beginning of the modification operation.

The next Word Cycle operation is Word Chain throughout the associative memory combined with trial division update for root words. The physical words which were argument words become root words during this operation. Modification bits come into these words by means of logic operations (OR's or AND's) between Flag 6 and the Shift Register in each of these words.

The logic operations are commanded bit-time-to-bit-time by the Write and Auxiliary Input lines (11 for OR, 10 for AND). The Word Cycle operation pauses for Flag Shift sequences to reload Flag 6 between bits being modified. If the argument was + (Flag 1=1) the root becomes $00.x[101]00...0_2$; if − (Flag 1=0), $00.x[011]00...0_2$, where the bits in the boxes are the bits that are changed. Each time the operation is repeated, the boxes move one bit position to the right.

This "step divide and then Word Chain with root update" sequence is repeated until all root bits have been evaluated.

Detailed Logical Description of the Individual Cell

The functional operation of a particular cooperative word parallel processor cell having been functionally defined as well as the data and control paths within the processor array, a possible implementation particularly suitable for P-channel field effect transistor LSI technology will now be described in conjunction with the logic diagram of FIG. 3, comprising FIGS. 3a through 3h. In this figure, conventional symbology has been employed:

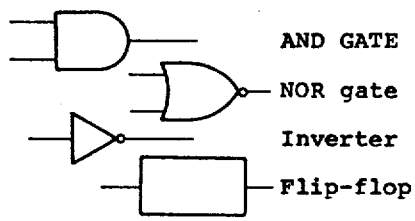

A bar over a signal designation implies inversion, and a heavy line indicates a plurality of independent signal paths.

1. Chain In Selection

One of the two Chaining Inputs, CHAIN IN 1 or CHAIN IN 2, is selected by the AND - OR - INVERT function comprising AND gates G-504, G-506 and NOR gate G-508. One or the other input is enabled, depending upon the state of flip-flop F 13. At power turn-on, this flip-flop comes up in a reset state, thus enabling CHAIN IN 1. F 13 can be toggled by having the WRITE control line active while the memory is in Fault Isolation Mode, if FLAG 1 is set (G-482). This can be disabled by DISABLE (from flip-flop F12). The first time that F 13 is toggled, CHAIN IN 2 is enabled; if it is toggled again, CHAIN IN 1 is again enabled. F 13 also selects which chaining input is enabled to the CHAIN OUT logic (discussed below), via G-501 and G-503. F 13 is a static flip-flop, as it must maintain its state indefinitely after the initial chain in selection is made.

2. Data Shift Register

The input to the 64-bit Data Shift Register 46 (comprising 62-bit shift register SR 1, and flip-flops F8 and F9 for the MSB and LSB respectively, is generated by an AND-OR-INVERT function comprising G-352, G-358, G-360, G-362, G-364, and G-366. In addition, G-354 and G-356 also drive G-366. Gates G-358, G-360, G-362, and G-364 are two input AND gates, with one input being data (FLAG 1, SR OUT, SUM or CHAIN IN) and the other input being a corresponding enable signal. The enable signals are based on the specifications in Table 1 (to be found above). AND gate G-352 effectively performs an OR function on SR OUT and DATA, when enabled during a multiplication by AND gate G-388 (discussed below).

ENABLE CHAIN IN TO SR IN (from NOR gate G-316) is a result of the individual cell being in Word State 2 (Flag 2 = "0", Flag 3 = "1") and the processor being in Word Chain sub-mode (A = $\bar{B}$) (gates G-310 and G-312). G-316 can be disabled by G-314 (discussed below). ENABLE SUM TO SR IN (G-320) is active if G-316 is not, and if Flag 4 is set, NO-OP = "0", and D = "1" (indicating that Add, Subtract, or Exclusive - OR is being executed). NOR gate G-320 can be disabled by G-314 or G-388. ENABLE FLAG 1 TO SR IN (from NOR gate G-318) is used only when performing division for transferring a quotient bit to the Shift Register in the quotient word. This signal is generated by LOAD and DIV active, with Flag 4 reset and Flag 5 set (indicating the quotient word) and A = "0" (indicating that Flag Transfer is not being executed). ENABLE SR OUT TO SR IN (from NOR gate G-322) is essentially a default condition resulting from the output of gates G-316, G-318, and G-320 all being "0". Gate G-322 can be disabled by gates G-314 or G-388. NOR gate G-314 disables gates G-316, G-320, and G-322 when AUX IN is active and FLAG 6 is set; with all the enable signals "0", SR IN is thus forced to a "1"; this is the desired result per the truth table given above with the functional description of the auxiliary input. NOR gate G-388 is used to generate the right shift required in each partial product formation when executing multiplication. NOR gate G-388 outputs a "1" during middle and last numeric bit times, if multiplication is being performed and FLAG 4 is set, this thereby enables G-352 to effectively OR signals SR OUT and DATA, as is required per the above functional description of multiplication. G-388 also enables SUM to Shift Register SR 1 (via gates G-394 and G-398); if G-388 is a "0", flip-flop F8 (the MSB of the data register) is enabled to SR 1. G-354 and G-356 force SR IN to a "0" if WRITE = FLAG 6 = $\overline{\text{AUX IN}}$, per the auxiliary input truth table.

NOR gate G-402 (in conjunction with gates G-400, G-408, G-410, G-414 and G-416) enables F 10 to F 11 and F 11 to SR OUT (G-416) during all numeric bit times (F OR G = "0", G-400) when Divide is indicated and FLAG 4 is set, thereby accomplishing a left shift per the functional description of division given above. At all other times, gate G-402 (in conjunction with inverter G-404, and gates G-412 and G-416) directly enables F 10 to SR OUT, and forces the input to F 11 (NOR gate G-408 and inverter G-410) to a "0". Flip-flop F 11 provides the extra bit position appended to the right end of the data shift register in order to produce the left shift required for each partial remainder while executing division; it is reset during No-op bit times so that SR OUT will be a "0" on the first numeric bit time. SR EXT OUT (F 9) is logically equivalent to SR OUT except during division. The reason for this flip-flop is to eliminate the propagation delay through G-416 when the Shift Register data is to be sent out the COMMON OUT or CHAIN OUT, both of which are already slow in view of the existing propagation delays caused by the divide logic.

3. Chain Out

ENABLE CHAIN IN TO CHAIN OUT (generated by gates G-324, G-326, G-328, G-336 and inverter G-330) is caused by POSN HOLD equal to "0" with Word State 0 (FLAGS 2 and 3 reset) and Word Cycle (G-324), or by Word State 2 or 3 (FLAG 3 set) of Flag Transfer (A = B = "1") (G-336), per Table 1 above. This ENABLE signal is also caused by FLAG 4 set with multiplication indicated (G-326), per the functional description of multiply, and by DISABLE. ENABLE FLAG 1 TO CHAIN OUT generated by gates G-326, G-336, G-334, G-342, and G-344 is caused by POSN HOLD = "0" with Word State 1 (FLAG 2 set, FLAG 3 reset) (G-334), by G-336, or by Flag Shift (G-342). G-344 can be disabled by G-326 (indicating multiplication) or DISABLE. G-336 causes both ENABLE CHAIN IN TO CHAIN OUT (G-330) and ENABLE FLAG 1 TO CHAIN OUT (G-344) since Flag Transfer Word States 2 and 3 enable CHAIN IN OR FLAG 1 to CHAIN OUT, per Table 1 above.

ENABLE SUM TO CHAIN OUT (from NOR gate G-332) is a result of Word State 2 of Word Chain sub-mode with FLAG 4 set, an arithmetic operation indicated (D = "1"), and the current bit a numeric bit. ENABLE SR OUT TO CHAIN OUT (G-346) is the default condition and results from the outputs of gates G-330, G-332, and G-344 being all "0".

ENABLE SR OUT, SUM, and FLAG 1 TO CHAIN OUT enable the respective data through gates G-370, G-372 and G-374. These outputs are ORed by NOR gate G-378. ENABLE CHAIN IN TO CHAIN OUT, via gate G-501 or G-503, enables either CHAIN IN 1 or CHAIN IN 2 through G-505 or G-507, dependent upon the state of the Chain Input Select flip-flop (F13). Gate G-509 creates CHAIN OUT by ORing G-379, G-505 and G-507.

4. Common Output

If Word Cycle is indicated and FLAG 7 is set (G-444), either SR EXT OUT via NOR gate (G-446) or CHAIN IN (G-448) is enabled to $\overline{\text{OUTPUT DATA}}$ (from NOR gate G-452), dependent upon the state of OUTPUT SR. During Flag Shift, FS INPUT TO FLAG 1 (G-440) is enabled (G-450) to $\overline{\text{OUTPUT DATA}}$. OUTPUT DATA is enabled to the external line $\overline{\text{COMMON OUT}}$ (by means of NOR gate G-454 and inverter G-456), unless disabled by DISABLE.

5. Adder

ENABLE COMMON IN TO ADDER (output by NOR gate G-264 and inverter G-266) is caused by either SELECT COMMON IN or by FLAG 5 set with Multiply or Divide indicated (G-262), per the functional description of multiplication. Multiply or Divide is detected by G-192. ENABLE CHAIN IN TO ADDER (G-264) is the inverse of ENABLE COMMON IN TO ADDER. COMMON IN data is enabled to NOR gates G-270 and G-272; CHAIN IN data is enabled to NOR gates G-274 and G-276. C enables false data to G-270 and G-274, and enables true data to G-272 and G-276. C = "1" when a subtraction is being performed (Subtract, Greater Than or Equal, or Less Than). In this way, DATA (the output from NOR gate 280 via inverter G-282) represents the desired polarity of the selected data. MULT 0 (from NOR gate G-278) forces DATA to a "0" when forming a partial remainder (MULT = "1") with a zero multiplier bit (Flag 1 = "0").

Gates G-156, G-158, G-160, and G-162 generate the carry output, CO, and gates G-164, G-166, G-168, and G-170 generate the $\overline{\text{SUM}}$. These gates constitute a full adder with $\overline{SR\ OUT}$, $\overline{DATA}$, and $\overline{CI}$ as inputs. The carry is stored in flip-flop F 14. During numeric bit times, CO is enabled to F 14 through G-140 and NOR gate G-142; during no-op bit times, the output of F 14 (through G-146) is enabled to its input through gates G-138 and G-142. $\overline{CI}$ (G-154), the carry input, is forced to an "0" at the first numeric bit time of a subtraction operation (C = $\overline{F}$ = G = "1") (gate G-144), as is required for 2's complement arithmetic. $\overline{CI}$ can also be forced to an "0" by FNLPP = "1" (gate G-146), which is used to add one to the LSB position of the last partial product when performing multiplication. $\overline{CI}$ is forced to a "1" when a Match or Exclusive-OR is being executed (C AND (D OR E) = "0", G-148 and G-150), and on the first numeric bit time of an addition operation (C = F = $\overline{G}$ = "0", G-152), unless FNLPP = "1".

6. Miscellaneous Arithmetic Logic

RESET FLAG 4 (No. 1) (output from NOR gate G-200) results from a mismatch occurring during Match or Approximate Match operations. (C = D = "0" for both match operations, F = "0" for numeric bits, and SUM = "1" when a mismatch occurs). RESET FLAG 4 (No. 2) (from NOR gate G-202) results from Greater Than or Equal and Less Than operations.

SR<DATA (G-128) indicates, at the sign bit position, that the Shift Register data is algebraically less than the comparison data, based on the following truth table:

| Comp Data | SR Data | Sum | SR<DATA |
|---|---|---|---|
| 0 | 0 | 0 | 0 |
| 0 | 0 | 1 | 1 |
| 0 | 1 | 0 | 1 |
| 0 | 1 | 1 | 1 |
| 1 | 0 | 0 | 0 |
| 1 | 0 | 1 | 0 |
| 1 | 1 | 0 | 0 |
| 1 | 1 | 1 | 1 |

It should be noted that DATA is the inverse of the comparison data, because this operation is performed by subtracting the comparison data from the Shift Register data. SR≥DATA and SR<DATA are ANDed with $\overline{E}$ and E, respectively (G-132 and G-134), then ANDed with C = "1", D = "0" (for magnitude comparison) and F = "1", G = "0" (for last numeric bit).

SET FLAG 5 (output by NOR gate G-206) detects arithmetic overflow. The logic comprising gates G-174, G-176 and G-178 detects a sum with a different sign than DATA and SR OUT. This is then ANDed by gate G-206 with D = E = "1" (for Add or Subtract), FLAG 4 set, and last numeric bit, G-206 being disabled by MULT OR DIV. RESET FLAG 5 (output by NOR gate G-204, used for Approximate Match, is the same as RESET FLAG 4 (No. 1), but with the additional requirement that FLAG 4 be reset (indicating one mismatch has already occurred) and E = "1" (for Approximate Match).

DIV (output by NOR gate G-102) decodes Divide (C(EXT) = D = WC = "1", E(EXT) = "0"). Gates G-106, G-108 and G-110 and inverter G-104 then enable either C (EXT) or FLAG 1 to C, depending on whether Divide is indicated (DIV = "1"), per the functional description given above. Similarly, DIV forces E to a "1", otherwise E = E (EXT) (implemented by NOR gate G-118

For division, the quotient bit is generated by the logic comprising gates G-284 through G-294. The output of NOR gate G-288 represents true divisor data (if C = "1", DATA is the inverse of the divisor, and is reinverted through G-284 and G-288). $\overline{Q\ BIT}$ (output by gate G-294) is a "0" if the divisor and the new partial remainder (i.e., SUM) have the same sign, per the functional description.

7. Flag Shift Operations

Flag Shift mode is indicated by FS (from NOR gate G-114) when both WC and FNLPP are "0". The Flag register consists of seven flip-flops (F1 through F7), but the inputs to only Flags 1 and 2 are directly controllable; Flags 2 through 7 function as a shift register (i.e., Flag 2 shifts to Flag 3, etc.).

There are four possible inputs to Flag 1, based on the LOAD and SR INHIBIT lines, as follows:

| Input to Flag 1 | LOAD | SR INHIBIT |
|---|---|---|
| Chaining Input | 0 | 0 |
| Flag 1 | 0 | 1 |
| Flag 2 | 1 | 0 |
| Flag 7 | 1 | 1 |

Gates G-432 through G-438 perform the selection indicated in the above table, and these four signals are ORed by gate G-440 to form FS INPUT TO FLAG 1. This signal is enabled to the FLAG 1 input gate (G-498) by $\overline{FS}$ (G-442). Flag 1 can also be changed while in Word Cycle. From Table 1, above, either Chain In or Chain In OR Flag 1 can be loaded into Flag 1, dependent upon sub-mode and Word State. However, these operations are inhibited while in Word Chain sub-mode (A = "0") during a multiplication or division (G-348). LOAD FLAG 1 is active when in Word Cycle and LOAD = G-348 = "1" (G-350). LOAD FLAG 1 enables Chain In to Flag 1 (G-492) when in Word State 1 (FLAG 2 set, FLAG 3 reset) and not in Position Hold (G-380). Chain In OR Flag 1 (G-494) is enabled when in Word State 2 (FLAG 2 reset, FLAG 3 set) of Flag Transfer (A = B = "1") (G-382). ENABLE M (G-384) allows transferring a multiplier bit from the data shift register to Flag 1 (G-500) when in Multiply and a multiplier word is indicated (FLAG 4 reset, FLAG 5 set). ENABLE Q (G-386) enables the Q BIT to Flag 1 (G-502) on the last numeric bit time (G = $\overline{F}$ = "0") of Divide, if a partial remainder word is indicated (FLAG 4 set). ENABLE FLAG 1 TO SR IN forces the input to Flag 1 to a "0". If none of the above enabling lines are active, and Flag Shift is not indicated, the state of Flag 1 is maintained by G-496.

There are seven possible inputs to Flag 2, plus a no change condition, based on lines A, F, and G, as follows:

| Input to Flag 2 | A | F | G |
|---|---|---|---|
| No change | 0 | 0 | 0 |
| Flag 1 | 0 | 0 | 1 |
| Flag 1 | 0 | 1 | 0 |
| Flag 7 | 0 | 1 | 1 |
| Flag 1 OR Flag 7 | 1 | 0 | 0 |
| Flag 1 AND Flag 7 | 1 | 0 | 1 |
| Set to "1" | 1 | 1 | 0 |
| Reset to "0" | 1 | 1 | 1 |

Gates 208 through 218 perform the selection indicated in the above table (G-190 forms FLAG 1 OR FLAG 7), and these seven signals are ORed in G-220.

SHIFT FLAG REG (G-196) is active if in Flag Shift and the no change condition is not indicated (G-194). The flip-flops comprising Flags 2 through 7 are implemented with two clock inputs: a hold clock (HC) and a shift clock (SC).

Clocking the HC input simply refreshes the flip-flop (i.e., the output is fed back to the input). Clocking SC loads the state of the D input into the flip-flop; the D input is the selected input for Flag 2, and the previous Flag for Flags 3 through 7.

Gates G-197 and G-199 and transfer devices T2 and T4 enable EXT CLK-01 to either the HC or SC inputs on the Flags, dependent upon the state of SHIFT FLAG REG. In addition, EXT CLK-02 must be "0" to enable 01. Flags 4 and 5 also have set (S) and reset (R) inputs. These inputs allow the RESET FLAG 4 (No. 1 and No. 2) and SET and RESET FLAG 5 signals to have the desired effect on the Flags, via transfer devices T6 through T12.

8. Stored Control Lines

Shift registers SR2 and SR3 hold the Word Cycle Control data. The registers are loaded during Flag Shift, and the data is utilized for performing Word Cycle operations. The shift registers have hold and shift clock inputs, which function in the same manner as those in the Flag flip-flops described above. G-484 detects the WRITE line active while in Flag Shift (and DISABLE not active). G-484 controls the shift or hold clock selection via G-487 and G-489, and transfer devices T 14 and T 16. When G-489 allows EXT CLK-01 through T 16, SR2 shifts in data from AUX IN and SR3 shifts in data from COMMON IN.

9. Disable

The DISABLE flip-flop (F12) can be set by any of four conditions when in Fault Isolation mode, dependent upon which control line is active, per the following table:

| Operation | Control Line |
|---|---|
| Set Disable F/F if Flag 1 = "1" | A |
| Set Disable F/F if Flag 1 = "0" | G |
| Set Disable F/F if data to Common Output = "1" | F |
| Set Disable F/F if Flag 4 = "1" | LOAD |

These functions are detected by G-460, G-462, GG-464 and G-466, and then ORed by G-468. By feeding the flip-flop output around to G-468, once the flip-flop is set, its input will stay a "1", and it thus cannot be reset. (The circuit design of the flip-flop is such that it always comes up in a reset state on power turn-on).

The structure of the processing array and its individual processing cells having thus been described in sufficient detail to permit one skilled in the digital computer art to construct such a machine, the following remarks concerning programming may prove useful.

Basic Programming Considerations

1. Chaining Channel

As with most functions in the Cooperative Word linear array processor, the use of the Chaining channel for each word is determined by a combination of a global command to all words and the states of Flag flip-flops in the particular word. One Flag in each word is used for interword Flag data communication. This is called the Head Flag, or Flag 1. Flags 2 and 3 help control Chaining channel operation. Three global commands enable most data exchange operations.

Within each word are two data storage sections, either of which may be connected with the Chaining channel. One is the Head Flag mentioned above. The other is main data storage for the word. This is in the embodiment described above a shift register, a 64-bit shift register.

a. Interword Data Exchange Operations

The basic Word Cycle mode interword data exchange operations are shown in FIG. 4. The three global sub-mode commands utilized are Word Chain, Position Hold, and Flag Transfer. The first global command on the figure, Word Chain, allows any of four Word States to be selected in individual words. The first state is Relay, which is commanded by 00 for Flags 2 and 3. The basic relay action is outlined by the corresponding diagram. For words in Relay state, Flag 1 is left unchanged, and the Data Shift Register is recirculated. If arithmetic is commanded, the results replace the corresponding bits in the Shift Register. The Chaining Input is gated directly to the Chaining Output. This allows words in the Relay state to transfer data from the word before to the word after.

The next state is Chain, commanded by 01. Again, the state of Flag 1 is unchanged. The Chaining Input loads new data into the Shift Register while the old data or the new result of arithmetic is gated to the Chaining Output.

The Clocked Relay state uses Flag 1. The Chaining Input is gated into Flag 1 while the previous contents of Flag 1 go to Chaining Output. The Shift Register is recirculated. Because a separate global control line enables clock pulses to Flag 1, Flag 1 and the Shift Register do not have to be clocked at the same rate. Clocked Relay can be used to transfer data efficiently many word places along the Chaining channel.

The fourth state allowed by the Word Chain command is "Recirculate" (Flag code 11). For words in this state, the state of the Head Flag is unchanged. The chaining Input is ignored unless it is commanded as an argument for arithmetic or a match. The Shift Register is recirculated while its contents are also output to the Chaining channel. If word arithmetic is commanded, its result replaces the corresponding bits of the Shift Register, but it is the original content of the Shift Register which is output to the Chaining channel. Although it is sometimes useful for all words of Cooperative Word linear array processor to be in the same word state during the execution of a global command, it is the ability of different words to have different word states simultaneously that gives the Cooperative Word linear array processor its great potential for data ordering. As will be shown, it is the ordering which leads to efficient parallel processing.

The second global command of FIG. 4 is Position Hold. When this global command is given to the Cooperative Word linear array processor, all its memory words assume the Recirculate word state. Unlike the other commands, Position Hold is independent of Flags 2 and 3, which permits these Flags to be used for the temporary storage of Flag data. The basic Recirculate action is the same as that described for recirculate with Word Chain. The Position Hold command is often used as a "No-op" operation to prevent data exchange on the Chaining channel during Word Cycle mode while other types of operations are being performed.

The final global command of FIG. 4 is Flag Transfer. In response to this command, all the allowable word states recirculate the data in the Shift Register. The command includes the Relay state discussed previously. All of the other allowed states make different uses of the Head Flag.

The second state shown is Flag Spread. In this state the Chaining Input and the old contents of Flag 1 are logically ORed together. The result is input to Flag 1 and output to the Chaining channel. This state is often used during setup for other data transfer operations. If a start and end point are marked in the processor by certain Flag conditions, Flag Spread can be used to set a 1 in the Head Flags of all intervening words.

The third state shown is Clocked Relay. Although in terms of hardware this is the same state as Clocked Relay used with Word Chain, the Head Flag will usually be clocked less often when executing Flag Transfer than when executing Word Chain. Often only one Head Flag clock pulse per entire Word Cycle operation is used with Flag Transfer.

The last word state is ORed Relay. In this state the Chaining Output is the logical OR of Flag 1 and the Chaining Input to the word. The contents of Flag 1 are not changed. This state can be used when programming a test to indicate if some condition had been met in certain previous words.

b. Word Selective Data Shifting

In addition to the word-to-word data exchanges, another type of data exchange is sometimes needed. The relative position of data fields in the Shift Registers of some words can be changed with respect to the relative position of data fields in other words by suppressing (for at least some clock pulses) Shift Register shifting in words in certain Word States. There are options to global transfer commands for selective shift suppression. Such field adjustments can enable setup for inter-word arithmetic or can allow the resynchronization of fields of words that had been transferred over the Chaining channel by the use of Clocked Relay.

c. Some Uses of the Chaining Channel

Although it includes only three different global commands, the data exchange instruction set with its various word states and options is extremely powerful and has a wide variety of uses. It is used primarily for supporting or for setups for other word cycle operations. Some of the uses are illustrated in the following examples, but many other uses exist.

FIG. 5 shows a convenient method of loading ordered data into the Cooperative Word linear array processor by means of the Chaining channel. All words of the memory are put into the Chain state, while Word Chain sub-mode global commands are executed. The entire memory then operates as a single large shift register and as many new words of data as are needed can be shifted in from the memory chaining input.

Figure 6:
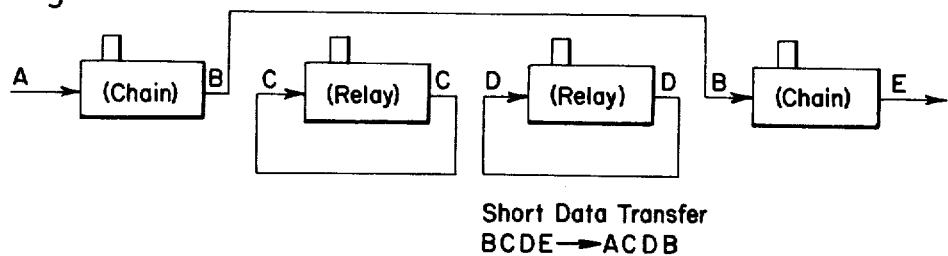

FIG. 6 shows one way that the relative positions of data may be interchanged in the Cooperative Word linear array processor. This is done by operating most of the memory in the Chain state. Selected words are put in the Relay state. Unless new data is also entering the memory by way of the Chaining channel, a global command causes the memory's Chaining Input to accept data from the memory's Chaining Output. In this way no memory data need be lost because the last memory word was in the Chain state.

Before the execution of the Word Cycle operation shown in FIG. 6, the four memory words contain the data words, BCDE. After the operation of data contained is ACDB. The B data has jumped to the right of C and D. This type of data exchange can be performed simultaneously in many different parts of the Cooperative Word Linear array processor memory.

Figure 7:
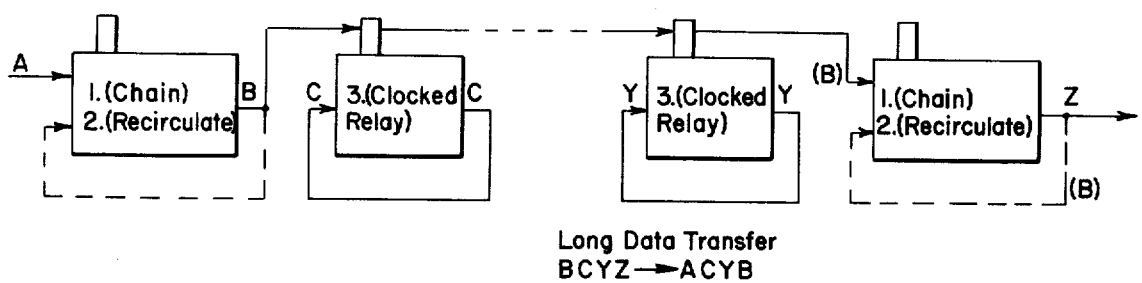

FIG. 7 shows a different type of data exchange. In this case the Clocked Relay state is used instead of the Relay state. In order to understand the significance of these different techniques, we must note that the Cooperative Word linear array processor does not necessarily use a constant clock rate. Most operations use a theoretical near-maximum clock rate, but the clock rate can be specified for each Word Cycle operation by data and control register 26 (FIG. 1). Using a chain of more than a few Relay words requires that the maximum clock rate be lowered because of the additional gate delays in the Chaining channel. This makes it slow to relay data very far on the Chaining channel. However, the clock rate does not need to be reduced with Clocked Relay.

In the example shown, th data word B jumps over 128 words which are in the Clocked Relay state. The complete jump takes three Word Cycle operations. The Clocked Relay words are in the Clocked Relay state for all three cycles. Other words Recirculate twice and are then operated in the Chain state for the third Word Cycle. The first Word Cycle loads the B word into the Head Flags of the first 64 words in Clocked Relay. The second cycle allows B to propagate into the Head Flags of the second 64 words. In the final Chaining Word Cycle, the data loads back from the Chaining channel into a word in Chain state. The starting data pattern was BC ... YZ. The final pattern as AC ... YB. B has skipped over C ... Y.

Figure 8:
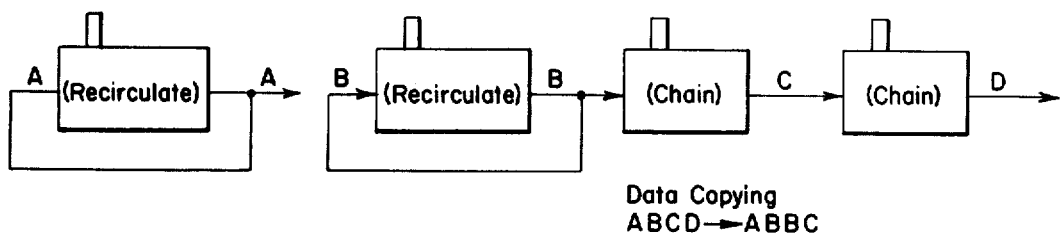

FIG. 8 shows how data may be copied into a neighboring word. The word to be copied and the preceding words are placed in the Recirculate state. Those following are in the Chain state. In the example ABCD was converted to ABBC.

Figure 9:
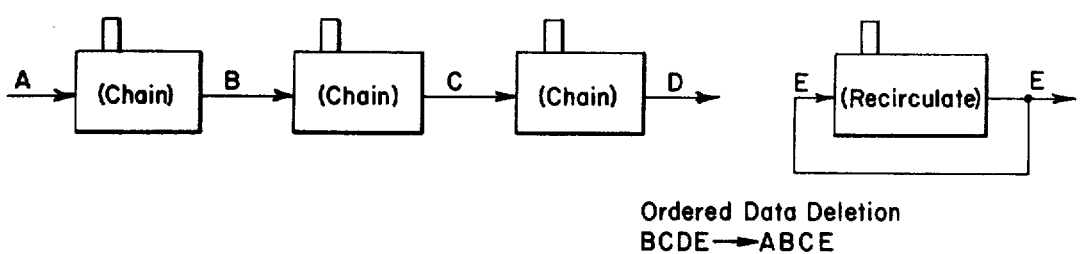

Whenever the contents of a word somewhere in memory are duplicated, the previous data in a word, usually somewhere else in memory, must be destroyed. One way to do this is shown in FIG. 9. Here, even the gap in an ordered sequence is removed. In the example BCDE was converted into ABCE. The data word D was completely removed.

Figure 10:
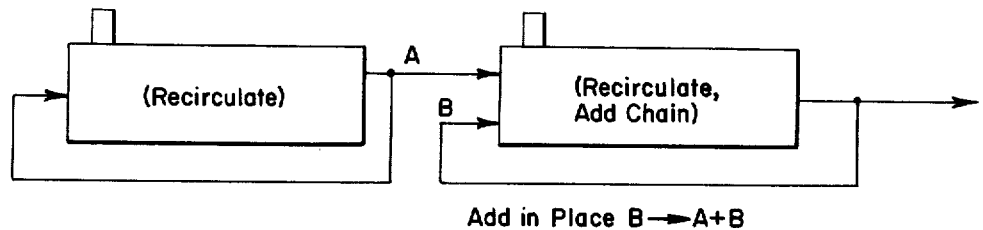

Some of the power of the Chaining channel is illustrated by its use in conjunction with word arithmetic. FIG. 10 shows a typical add-in-a-place, where the addition is from the Chaining channel. The Add command goes to the word initially containing the data word B. During a single Recirculate Word Cycle, the data from Chaining Input (A in this case) is added to the initial data in the word B, and the result (A + B) is stored in the same word, now identified as A + B. Such additions can take place simultaneously in many different words of the Cooperative Word linear array processor.

Figure 11:
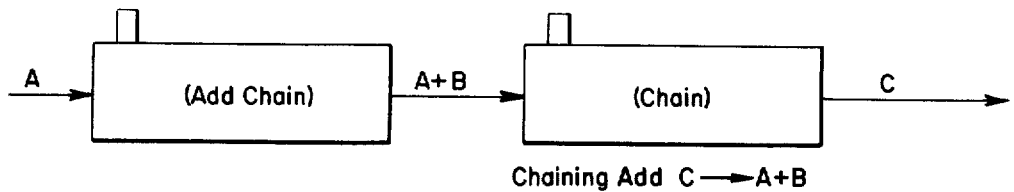
Figure 12:
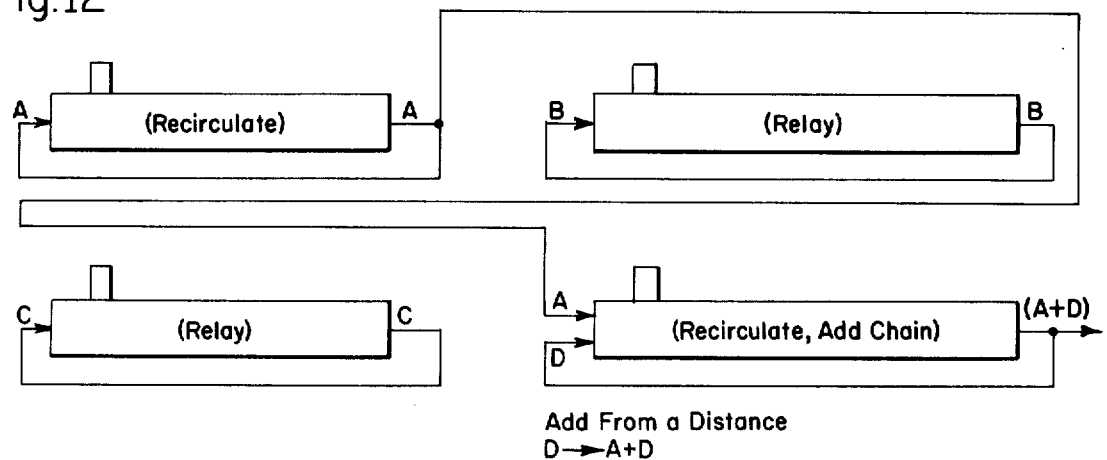
Figure 13:
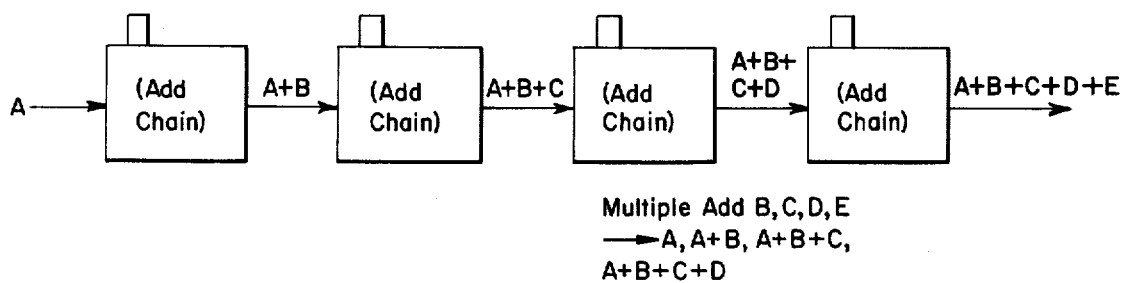

FIG. 11 shows that addition is also convenient for words in the Chain state. If Relay states are used, arguments do not have to be in adjacent words. This is illustrated by FIG. 11. FIG. 12 shows an even more complex addition sequence. Four words are being summed together in a single word Cycle operation. This is an example of another operation which requires a slower clock rate. However, an advantage of the technique is that setup is convenient. In some cases, however, adding together terms in sub-groups, followed by addition of the partial sums, is faster to execute but more complicated to program.

2. Other Data Communication Channels

All channels of data communication to the Cooperative Word linear array processor have been shown above in FIG. 1. They are the Chaining channel 14, which has already been discussed, three common data buses, namely the Common Input 18a, the Auxiliary Input 18b, and The Common Output 20. Each of these has a connection to every word in the processor. All channels carry bit-serial data. All can frequently be used simultaneously.

The Common Input channel may be used to supply common arguments to all words for matching or for arithmetic. If words are first cleared (set equal to 0), the Common Input channel can also be used to input new data. Detailed use of the Common Input channel will be discussed later when the matching and arithmetic operations are described.

The Auxiliary Input channel is more often used for data input. Its use is controlled by a common control line, the WRITE line, and by Flag 6 in each word. The control can be dynamically varied bit-time to bit-time so that write fields may be programmed in any desired pattern.

The normal write operation replaces data in specified fields of all words with Flag 6 set to 1. Other options exist. Input data may be logically ANDed or ORed with stored data in specified fields of selected words. Alternatively, the contents of Flag 6 in all words may be copied into or logically combined with specified Shift Register bits.

The Common Output bus is arranged to supply the logical OR of all words trying to output. During Word Cycle operations, Common Output in a word is enabled by a 1 in Flag 7. The usual output is the contents of the Data Shift Register. Normally only one word is activated at a time. An alternative mode outputs the word's Chaining Input. This can be used to indicate the completion of certain long Flag Transfer operations. At other times the Common Output channel can be used to test certain Flag conditions.

As an example, consider a typical associative memory output operation. Assume that a Match is first ordered on a specified field of all memory words. At the conclusion of the Match, a 1 is set in Flag 4 of each matching word. (It is expected that more than one word may have matched.) The problem is to read out all matching words one after the other. They must not be ORed together.

Figure 14:
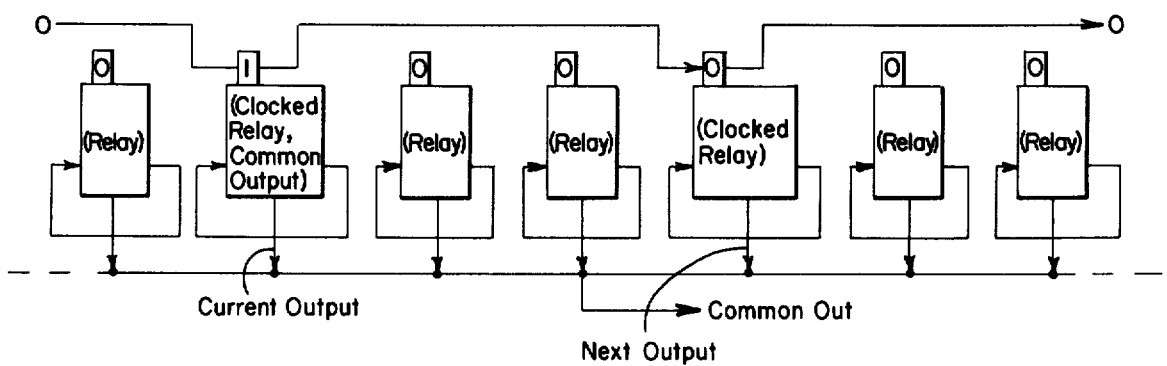

The solution is to set all Head Flags to 0 and to set all words with a 1 in Flag 4 to the Clocked Relay Word State. Words with a 0 in Flag 4 are set to the Relay state. Now a single 1 is clocked once into the Chaining channel. It goes to the Head Flag of the first previously matched word. The contents of Head Flags can then be copied to their corresponding Flag 7's. A Word Cycle operation can then be commanded to output the first matched word. During this word cycle operation, the Head Flag's 1 can also be chained to the next matching word. This action is diagrammed in FIG. 14. Output word cycles follow each other with only short flag set operations in between. When the processor Chaining Output is one, it indicates that all matching words have been output.

3. Match and Short Arithmetic Operations

Each processor word has an arithmetic section, which is used in conjunction with Flags 4 and 5 and with the Common Input channel. The arithmetic section is also used to provide match capability. Althogh all proposed associative processors have some match capability, the Cooperative Word linear array processor has more arithmetic capability than many others. The arithmetic section is designed to work simultaneously with data reordering, data input, and data output during Word Cycle operations.

Two dynamically programmed global control lines allow complete program control of data fields for arithmetic. Any Shift Register bit-time may be indicated as a first bit (least significant), a middle numeric bit, a final numeric bit (sign bit), or a no-operation bit. Any number of data fields may be defined for a 64-bit physical word. For most arithmetic operations, No-op fields may be established inside a single arithmetic field. In most cases arithmetic fields may even continue across physical word boundaries, if desired.

Arithmetic fields are assumed to contain signed fractional numbers. The 2's complement representation is used for negative numbers. The sign bit is the most significant bit of an arithmetic field with 1 indicating "−".

Even greater flexibility is allowed for matches and arithmetic by individually programming the number of clock pulses for each word cycle operation. This allows different operations to be commanded for different fields of the same words.

The arithmetic operations are globally commanded. Execution in specific words usually requires the condition that Flag 4 be set to 1. These operations all use the contents of the Shift Register as one argument. The second argument is always optional. It can be commanded to be either the data on the Common Input channel or the data at Chaining Input to each word. When Chaining Input is commanded, what data is actually on the Chaining Input depends upon current data exchange commands and individual word states. The destination of the results of the arithmetic is also determined by data exchange commands.

The global match and short arithmetic commands are shown in Table 3. Exact Match is the classic associative memory match operation. This match is satisfied if each bit of all specified match fields in the Shift Register is the same as the corresponding bit of the reference input. The reference input may be specified to be either the Common Input or the Chaining Input. The result of the match in each memory word is indicated by Flag 4. As a setup, a 1 is loaded into the Flag 4's of all words where the match is to be tested. During the Exact match operation, if a non-match is detected in a word, that word's Flag 4 is reset. Any 1's left after the operation indicate that the match has been made. The match operation does not change Shift Register data.

Approximate Match is the same as Exact Match except that one bit may mismatch. It does not matter which particular bit mismatches. The Approximate Match operation uses Flag 5 to indicate the Approximate Match results. The same operation simultaneously checks for Exact Match with Flag 4.

The Greater Than or Equal Match is an arithmetic comparison. If the Shift Register data are greater than or equal to the reference data for each specified arithmetic field, Flag 4 is left equal to 1. Data in the Shift Register are not changed as a result of this operation.

The Less Than Match is another arithmetic comparison. Its operation is similar to the Greater Than or Equal Match. Both of these matches can be used in sequence to test for a match between limits.

The Exclusive-OR operation does modify Shift Register data. It requires a 1 in Flag 4 for execution. Exclusive-OR with all 1's from Common Input can be used to compute a 1's complement.

Add and Subtract are also activated with a 1 in Flag 4. If Flag 5 is preset to 0, a 1 in Flag 5 indicates overflow. When subtraction is commanded, the second argument is subtracted from the contents of the Shift Register in the memory word.

TABLE 3

| MATCH AND SHORT ARITHMETIC OPERATIONS | |
|---|---|
| Exact Match | Sets flag 4 to 0 on mismatch |
| Approximate Match | Sets flag 4 to 0 on first mismatch |
|  | Sets flag 5 to 0 on second mismatch |
| Greater-than-or-Equal Match | Sets flag 4 to 0 on mismatch |
| Less-than Match | Sets flag 4 to 0 on mismatch |
| Exclusive-OR (complement) | Enabled by 1 in flag 4 |
| Add | Enabled by 1 in flag 4 |
|  | Sets flag 5 to 1 if overflow |
| Subtract | Enabled by 1 in flag 4 |
|  | Sets flag 5 to 1 if overflow |

4. Extended Arithmetic Operations.

Figure 15:
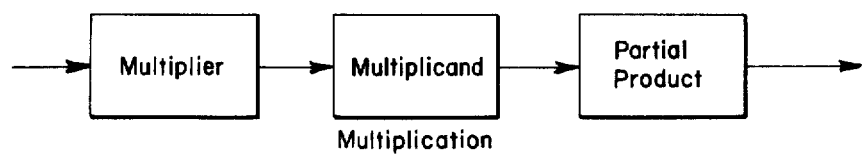

Special hardware may be combined with microprogramming techniques for the efficient execution of more complex arithmetic operations in the Cooperative Word linear array processor. These complex operations require coordinated interaction between several memory words for each execution. A configuration for multiplication is illustrated in FIG. 15. This operation consists of a sequence of global step multiply operations using special Multiply states. Although all words are physically identical, different Multiply states are determined by the settings of Flags 2–5. Flag 1's are used to transfer multiplier bits.

Multiplication starts with the product words being cleared. Then the products are computed one multiplier bit at a time using step multiply operations. These operations include combined conditional add (of multiplicand) with shift right (of product) in single word cycle operations. The sign bit is computed with a conditional subtraction.

Multiplication is also field programmable. Arithmetic field control lines apply to multiplicands and products with the restriction that the fields must be continuous and in single physical words. The multiplier fields may be different because they are determined with the load line.

The multiplicands can either be in a memory word as shown or they can be obtained from the Common Input channel. Both types of multiplication can be intermixed in the processor and executed simultaneously.

FIG. 15 shows one of the simplest Multiply configurations. More elaborate multiple field multiplication patterns can be programmed. Often Relay Word States are also used. Step multiply operations also have several non-multiply potential uses.

Figure 16:
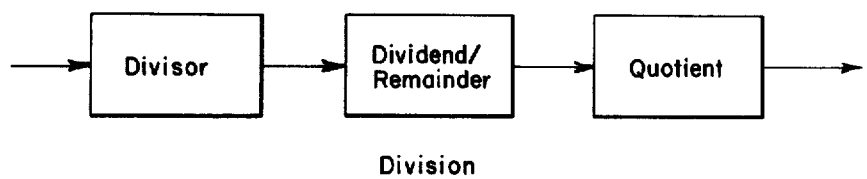

Division is shown in FIG. 16. Flags 2–5 command divide states such as divisor, divident-remainder, and quotient. Flag 1's are used to transfer quotient bits to quotients. Global commands may be microprogrammed using step divide operations.

A nonrestoring division algorithm is used. One bit of the quotient is developed for each complete word cycle operation. The main arithmetic is executed in dividend-remainder words. The step divide operations combine shifting, adding or subtracting, and sign comparison.

As with multiplication, there is great flexibility in division setup. Relay words can be used, Fields can be programmed with quotient fields separately programmable. Divisors can come from memory words or the Common Input channel, and both cases can be executed simultaneously.

There may also be microprogram sequence for efficient execution of square roots. This too would make use of some of the Divide hardware.

5. Effective Self-Repair

Since each word is a microprocessor, the Cooperative Word processor is a true processing array. This processing array can be thoroughly tested by programs that use its normal operation codes. However, when trouble is detected, special hardware features are needed for effective self-repair. These features are the Fault Isolation operations.

When a word goes bad, it is necessary to avoid a break in the Chaining channel that will keep other good words from using the Chaining channel. There is enough redundancy in the Chaining channel to make the probability of restoring it high. Some of this redundancy has been shown in FIG. 1. There are two Chaining Input lines 14a and 14a' to each processor word cell. If the normal input to a given cell, coming from the previous cell, does not supply valid data, a command can switch that word to its Alternate Chaining Input (the input from the cell prior to the previous cell). Alternate Chaining Inputs are commanded only for self-repair. Changes to Alternate Chaining Input are never commanded during normal data processing.

Each word cell also contains a Disable flip-flop. When a test shows that a word is bad, a command can place it in the "off" state. In the off state the word's common output is left 0 (inactive). The bad word is also forced to the Relay state for its chaining channel. Unless the Chaining channel gates in the word are bad, the bad word can help keep the Chaining channel open. Consecutive bad words can usually be tolerated.

6. Processing Control and Setup a. Processing Modes

In order to make it possible to control the Cooperative Word processor efficiently, three quite different overall global modes are time shared. These are Flag Shift, Word Cycle and Fault Isolation. The three different modes are quite distinct and are optimized in different ways.

Flag Shift is the main setup mode. Its operations set and transfer data among the seven flags in each word. The mode also includes logic operations which can be used to combine Flag data in each word. An operation like Clocked Relay allows Head Flags to exchange data with the Chaining channel, and global tests for Flag states can be executed using the Common Output channel. Flag Shift operations are single-clock-time operations. A sequence of Flag Shift operations can be executed rapidly. While Flag Shift operations are in progress, none of the main Data Shift Registers in the processor words can be shifted.

The Word Cycle mode is the main processing mode for the Cooperative Word linear array processor. Word Cycle operations operate on data fields stored in the Shift Registers 46 (FIG. 2). The control is by global commands modified by local Flag data. Flexibility and the ability to do many different types of operation simultaneously are emphasized.

In the Fault Isolation mode, Fault Isolation commands are executed. The operations are few in number, but they must be executed with high confidence. Hardware and command redundancy is emphasized. Several different commands will turn a word off. Each operation has its own control line, but most are conditional on a specific flag and its state. During Fault Isolation, Data Shift Register, Word Cycle Control Register, and Flag data are preserved.

b. Simultaneous Operations

By way of summary, the various combinations of commands that can be executed simultaneouslly during the same Word Cycle mode are shown in Table 4. Headings along the top row list the Flags and other hardware features used by the operations in each column. Several operations, limited to one from each column, can be executed simultaneously. For example, Word Chain, Exact Match, Input, and Output can all be executed simultaneously. The wider entries use more resources and leave less opportunity for simultaneous operation. For example, only the Common Output channel is available during computation of square roots.

It should be remembered that in addition to the capability for simultaneous commands, the Cooperative Word linear array processor also has the capability for simultaneously executing the same commands in different words or groups of words. Matches often take place in every memory word. Addition to every word is possible. The same data may be input to many different words at the same time.

c. Processing Speed

It should be clear from the previous discussion that overall processing speed is program dependent. The complexity of the Flag Shift sequences needed between Word Cycle operations, the amount of simultaneous processing possible per Word Cycle operations, and the number of Word Cycle operations that must be executed with a slower clock rate all depend upon the details of specific application programs. If many different operations are executed on short data fields in the same physical words, fewer Word Cycle clock pulse times per operation are needed, but each operation still requires clock pulses for Flag Shift setups. Match operations often attain a very high degree of parallelism because all memory words are frequently matched. When it is possible to perate Input and Output operations simultaneously with processing, the overall processing speed will increase. For many applications, operations requiring very slow clock rates are not needed.

Three equations may be used to obtain approximate operating speed over a wide range. They are:

$$\text{Short instruction rate} \quad S_{IR} = \frac{N_P C_R}{B + S_U} \quad (1)$$

$$\text{Long instruction rate} \quad L_{IR} = \frac{N_P C_R}{B_M B + S_1} \quad (2)$$

$$\text{Square Root rate} \quad S_{RR} = \frac{N_P C_R}{2B_R(B + F_S) + S_U} \quad (3)$$

Short instructions include matches, additions, and other operations executable with a single Word Cycle operation. When Input or Output operations cannot be overlayed with other operations, they should also be considered short operations. $N_p$ is the number of words doing the operation in parallel. For some match operations this is the number of words in the memory. $C_R$ is the average clock rate. For a mix of operations the clock rate may not be constant. $B$ is the average number of bits involved in the corresponding arithmetic fields. $S_U$ is the number of clock pulse times needed to set up for the operation. These are usually Flag Shift clock pulse times.

The long instructions of equation (2) are Multiplication and Divide. $B_M$ is the number of bits in the multiplier or quotient. For equation (3) $B_R$ is the number of bits in the root and $F_S$ is the average number of Flag Shift clock times needed per Square Root Word Cycle.

TABLE 4

| SIMULTANEOUS OPERATIONS POSSIBLE IN WORD CYCLE MODE (Pick one from each column) | | | |
|---|---|---|---|
| Flags 1, 2, 3 | Flags 4, 5 | Flag 6 | Flag 7 |

| | Flags 1, 2, 3 | Flags 4, 5 | Flag 6 | Flag 7 |
|---|---|---|---|---|
| Processing Hardware | Chaining channel Dynamic shift inhibit Position hold | Common input Word adder Arithmetic enable control Exact match Approximate match Greater-than-or- | Auxiliary input Input enable control Input data | Common output |
| | Word chain | equal match Less-than match Exclusive-OR (complement) | OR input with memory AND input with memory Flag 6 to memory | Output memory |
| Operations | Flag Transfer | Add Subtract Step multiply | Flag 6 OR with memory Flag 6 AND with memory | Output word chaining input |

TABLE 4-continued

SIMULTANEOUS OPERATIONS POSSIBLE IN WORD CYCLE MODE
(Pick one from each column)

| Flags 1, 2, 3 | Flags 4, 5 | Flag 6 | Flag 7 |
|---|---|---|---|
| | Step divide | No input | |
| | Square root | | |

Programming Examples

1. Parallel Arithmetic Computations

One of the most powerful features of the Cooperative Word linear array processor memory is its capability to perform many arithmetic calculations simultaneously. This capability results from two features of the processor. First, each cell has an arithmetic processing capability and secondly, the Chaining channel is able to transfer arithmetic operands and results between cells.

The parallel arithmetic capability is best utilized in applications in which similar processes are performed on many different sets of data, or in general, when there are a great many independent calculations to perform. Among such applications are acquisition and tracking of radar targets or threats, inversion of matrices, solution of partial differential equations by relaxation, some types of numerical integration, and many statistical calculations.

An example that illustrates the arithmetic processing capability of the Cooperative Word linear array processor is shown in Table 5, which shows the layout of the contents of a region of 68 contiguous words of memory as they are used in evaluating a set of arithmetic functions in a series of parallel arithmetic operations. The set of functions is taken from an actual track-while-scan application. In this application many sets of identical functions are evaluated simultaneously and different data values are used for each set. However, only one such set is shown because the process as well as the program itself is identical for each of the sets.

The set of functions to be evaluated is the following:

$P'(1,1) =$
$\quad D(4)P(1,1) + 2D(4)P(1,2) + 2D(4)P(1,3)$
$\quad + 2P(1,2) + 2P(1,3) + 4P(2,2)$
$\quad + 8P(2,3) + 4P(3,3)$
$P'(1,2) =$
$\quad D(4)P(1,2) + 2D(4(P(1,3) + 2P(2,2)$
$\quad + 6P(2,3) + 4P(3,3)$
$P'(1,3) =$
$\quad D(4)P(1,3) + 2P(2,3) + 2P(3,3)$
$P'(2,2) =$
$\quad D(5)P(1,2) + 2D(5)P(1,3) + P(2,2)$
$\quad + 4P(2,3) + 4P(3,3)$
$P'(2,3) =$
$\quad D(5)P(1,3) + P(2,3) + 2P(3,3)$
$P'(3,3) =$
$\quad P(3,3) - D(3)P(1,3) + K$ The entire evaluation of the preceding six functions, whether for one or for many sets of values, requires a total of one global addition operation, one global subtraction operation, two global multiplication operations, and 27 global copy operations.

Table 5 contains seven columns of figures. The first of these is a list of the word numbers for the Cooperative Word linear array processor words whose contents are illustrated. (These numbers are assigned by the programmer only for convenience, since the hardware is sensitive only to order or relative position.) The direction of the Chaining channel is in the order of increasing word number. The second column contains the initial word contents before initiation of calculations. The third column shows the changes in the memory contents resulting from the copy operations. The remaining columns show the changes in word contents for each of the remaining operations.

Each copy operation is performed by setting the source-word location to Recirculate state, the destination-word location to Chain state, leaving all intervening words in Relay state, and then executing a Word Chain operation. For example, the copy of the operand D(4) from Word 1 to Word 23 is performed after setting Word 1 to recirculate state and Word 23 to chain state. The copy of D(4) to Word 38 would then be performed by setting Word 23 to Recirculate state and Word 38 to Chain state and performing another Word Chain operation. It is significant that each of these copy operations is performed simultaneously for all sets of functions being evaluated.

The first of the multiplication operations is performed next, after each multiplier, multiplicand, and product word is set to the corresponding state. Clearly the same multiplier is sometimes used with several different multiplicands in the same multiplication operation. For example, the operand D(4) in Word 1 is multiplied by the operands in Words 2, 4, and 8 to produce products in Words 3, 5 and 9, respectively.

Multiplication is performed by a subroutine which performs repeated step-multiply operations. The number of step-multiply operations is equal to the number of bits in the multiplier. As each step-multiply operation requires a complete Word Cycle, the multiplication process is the most time-consuming operation of the entire arithmetic calculation process. The second multiplication operation follows the same order to setup and execution as the first.

The single addition operation is performed next. In this operation, unlike the multiplication operations, several operands may be added together at once. For example, all of Words 3, 7, 10, 12, 14, 17, 20 and 22 are added together, with the sum being put in Word 22. For this operation the first operand in each such set is put into the chain state with Flag 4 reset. Each of the other operands but the last is put into chain state with Flag 4 set. The last operand is put into recirculate state with Flag 4 set.

After the addition operation is completed, all of the functions except the last have been evaluated. The subtraction operation is then used to complete the evaluation of the last function. The Word States for subtraction are the same as for addition, but the Word Cycle operation includes the global subtraction command rather than addition. In each of the columns in the Table the word contents are shown only for those words whose contents have changed since the preceding operation.

In the process of presetting the word states before performing each of the arithmetic or copy operations there are two principal ways of identifying the words to be set to each particular state. One is by tagging the words initially in some reserved bit positions in their data registers, and then doing an Exact Match operation to select the set of words to be set to particular states. The other, which is the one used in the programmed application, is as follows. First each region of memory in which the set of functions is to be valuated (assuming many sets, with Table 5 illustrating the region of memory for one set) is preceded by a word having a unique type of content called a "header word." The first step in the Word State setup is to locate by an Exact Match all of the header words and set their Head Flags. Next, the Head Flags are all chained down the Chaining channel to the first operand whose Word State is to be set (which will be Word 1 in the example). Because the relative locations of corresponding operands are the same in all memory regions for the same set of functions to be evaluated, every Flag setup operation can be performed for all such data regions simultaneously.

The selected words, which now have their Head Flags set, are next set to the desired state using Flag Shift operations. The OR operation of ORing the state of the Head Flag into another Flag is used so that only the Flags for the selected words will be affected. The Head Flags are then chained to the next operand, and the setup operation is repeated for the resulting selected words, and so on for the remaining operands.

TABLE 5

MEMORY LAYOUT FOR ARITHMETIC EXAMPLE

| Word No. | Initial Contents | After Copies | After First Multiply | After Second Multiply | After Addition | After Subtraction |
|---|---|---|---|---|---|---|
| 1 | D(4) | | | | | |
| 2 | P(1,1) | | | | | |
| 3 | | | D(4)P(1,1) | | | |
| 4 | P(1,2) | | | | | |
| 5 | | | D(4)P(1,2) | | | |
| 6 | 2 | | | | | |
| 7 | | | | 2D(4)P(1,2) | | |
| 8 | P(1,3) | | | | | |
| 9 | | | D(4),P(1,3) | | | |
| 10 | | | | 2D(4)P(1,3) | | |
| 11 | P(1,2) | | | | | |
| 12 | | | | 2P(1,2) | | |
| 13 | P(1,3) | | | | | |
| 14 | | | | 2P(1,3) | | |
| 15 | 4 | | | | | |
| 16 | P(2,2) | | | | | |
| 17 | | | | 4P(2,2) | | |
| 18 | 8 | | | | | |
| 19 | P(2,3) | | | | | |
| 20 | | 4 | | 8P(2,3) | | |
| 21 | P(3,3) | | | | | |
| 22 | | | 4P(3,3) | | P'(1,1) | |
| 23 | | D(4) | | | | |
| 24 | | P(1,2) | | | | |
| 25 | | | D(4)P(1,2) | | | |
| 26 | | P(1,3) | | | | |
| 27 | | | D(4)P(1,3) | | | |
| 28 | | 2 | | | | |
| 29 | | | | 2D(4)P(1,3) | | |
| 30 | | P(2,2) | | | | |
| 31 | | | 2P(2,2) | | | |
| 32 | 6 | | | | | |
| 33 | | P(2,3) | | | | |
| 34 | | | 6P(2,3) | | | |
| 35 | | 4 | | | | |
| 36 | | P(3,3) | | | | |
| 37 | | | 4P(3,3) | | P'(1,2) | |
| 38 | | D(4) | | | | |
| 39 | | P(1,3) | | | | |
| 40 | | | D(4)P(1,3) | | | |
| 41 | | 2 | | | | |
| 42 | | P(2,3) | | | | |
| 43 | | | 2P(2,3) | | | |
| 44 | | P(3,3) | | | | |
| 45 | | | 2P(3,3) | | P'(1,3) | |
| 46 | D(5) | | | | | |
| 47 | | P(1,2) | | | | |
| 48 | | | D(5)P(1,2) | | | |
| 49 | | P(1,3) | | | | |
| 50 | | | D(5)P(1,3) | | | |
| 51 | | 2 | | | | |
| 52 | | | | 2D(5)P(1,3) | | |
| 53 | | P(2,2) | | | | |
| 54 | | 4 | | | | |
| 55 | | P(2,3) | | | | |
| 56 | | | | 4P(2,3) | | |
| 57 | | P(3,3) | | | | |
| 58 | | | | 4P(3,3) | P'(2,2) | |
| 59 | | P(1,3) | | | | |
| 60 | | | D(5)P(1,3) | | | |
| 61 | | P(2,3) | | | | |
| 62 | | 2 | | | | |
| 63 | | P(3,3) | | | | |
| 64 | | | 2P(3,3) | | P'(2,3) | |
| 65 | | P(3,3) | | | | |
| 66 | D(3) | | | | | |
| 67 | | D(3)P(1,3) | | | | |

TABLE 5-continued

MEMORY LAYOUT FOR ARITHMETIC EXAMPLE

| Word No. | Initial Contents | After Copies | After First Multiply | After Second Multiply | After Addition | After Subtraction |
|---|---|---|---|---|---|---|
| 68 | K | | | | P(3,3) + K | P'(1,3) |

2. Symbol String Searching

The use of the Cooperative Word linear array processor for symbol string searching is illustrated in this example. The ability of the Chaining channel to effectively make the entire processor into a single shift register is very useful in text searching and in symbol manipulation operations. For example, assume that it is desired to search a single symbol string for a particular sequence of characters. Assume further that the desired string will fit into a single word of memory. Search can then be performed in a number of parallel compare operations (i.e., Exact Matches) which equals the number of characters that the memory word can hold. The number of such operations is independent of the position of the desired symbol string in the text being searched. For instance, parts of the symbol string may reside in two adjacent words in the processor.

The search operation consists of placing the desired symbol string in a buffer register connected to the Common Input channel and then performing repeated Exact Match operations against the text in memory, while searching only that portion of the register which contains the symbol string. After each such operation the entire text in memory is shifted one character position, with the output from each data register being shifted into the data register of the next word. This shifting capability is enabled by putting every word in the processor into Chain state and using the Word Chain operation for the shift. The position of the desired symbol string in the Common Input channel buffer register remains the same for each match operation.

Figure 17A:
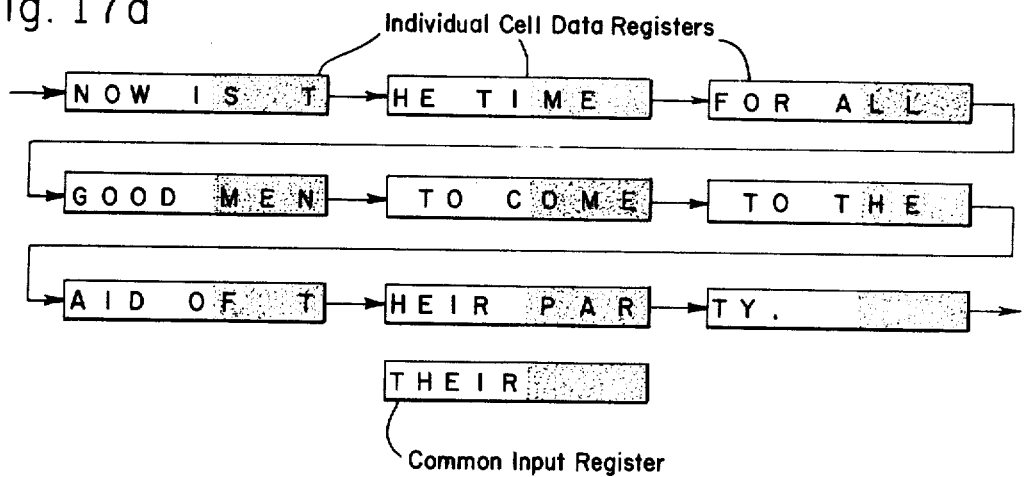
Figure 17B:
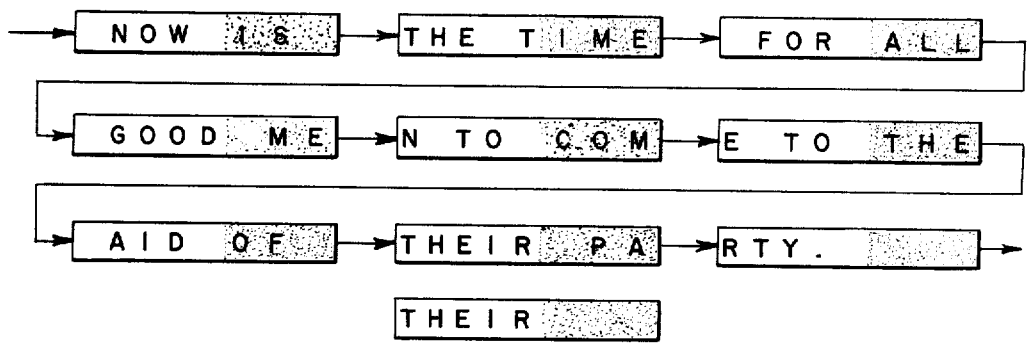
Figure 17C:
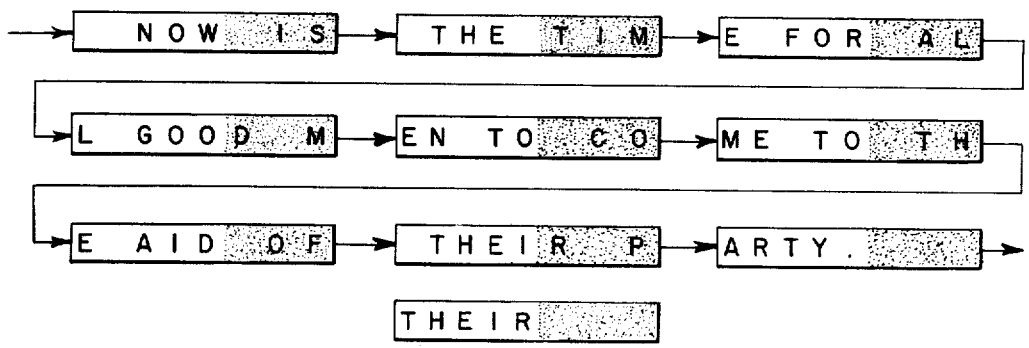

FIGS. 17(a), (b), and (c) illustrate a search operation of the type just discussed. In this example the text being searched in the sequence of characters "NOW IS THE TIME FOR ALL GOOD MEN TO COME TO THE AID OF THEIR PARTY," and the desired symbol string is "THEIR". The three figures illustrate the first three of the eight compare operations potentially required and show the orientation of the text in memory for each of the searches. The register connected to the Common Input channel is shown at the bottom of each figure. The portion of that register that does not contain the desired symbol string is shaded, and the part of each memory word that is not searched is also shaded. It can be seen that a successful match is made on the second of the three searches.

This text-searching mode of operation can be easily extended to searches for symbol strings too long to be contained in a single register. The number of exact match operations required is approximately equal to the number of words required to hold the desired symbol string multiplied by the number of characters which a single word can contain. In the example, this latter number is eight.

What is claimed is:

1. In an array processor having a chaining channel for connection of individual processing cells into a linear processing array:

a data storage register in each of said processing cells for storing data for processing by said cell;

chaining channel input means in each of said processing cells for receiving signals from a preceding cell;

chaining channel output means in each of said processing cells for providing output signals to a succeeding processing cell;

control source for generating a plurality of control signals;

a plurality of flag flip-flops in each of said processing cells for storing flag data in response to said control source, said flag data including data representative of three mutually exclusive data transfer operations;

first gating means in each of said cells coupling said chaining channel input means and said chaining channel output means, said first gating means for decoding said flag data representative of said first data transfer operation and for enabling said cell to transfer data from said chaining channel input means to said chaining channel output means in response to a first control signal from said control souce;

second gating means in each of said processing cells coupling said chaining channel input means, said data storage register and said chaining channel output means, said second gating means for decoding said flag data representative of said second data transfer operation and for enabling said cell to transfer data simultaneously from said chaining channel input means to said data storage register and for enabling data transfer from said data storage register to said chaining channel output means in response to said first control signal from said control source; and third gating means in each of said processing cells coupling said chaining channel input means, said first flag flip-flops and said chaining channel output means, said third gating means for decoding said flag data representative of said third data transfer operation and for enabling said cell to transfer data from said chaining channel input means to said first flag flip-flop and for enabling data transfer from said first flag flip-flop to said chaining channel output means in response to said first control signal from said control source.

2. The processor according to claim 1 further comprising:

means coupled to each processing cells for providing individual flag data representative of each of said three mutually exclusive data transfer operations to three of said processing cells, respectively, said cells responding to said first control signal and respectively providing said three data transfer operations simultaneously.

3. The processor of claim 2 further comprising:

fourth gating means within each of said processing cells for decoding a flag-spread word transfer state and for enabling a data present on the chaining channel input of the cell with data present in a particular one of said flag flip-flops is transferred to the chaining channel output of said cell in response to a second control signal from said control source.

4. The processing array of claim 3 wherein the data transferred to the chaining channel output of said cell is additionally transferred to said flag flip-flop.

5. The processing array of claim 4 further comprising fifth gating means for decoding an ORd relay word transfer state and for enabling a data transfer operation wherein the logical OR of data present on the chaining channel input to said cell with data present in said particular one of said flag flip-flops is transferred to the chaining channel output of said cell without affecting the data stored in said flag flip-flop.

6. In a linear array of processing cells providing isolation of a faulty processing cell, each processing cell including means for detecting a faulty processing cell, an input terminal coupled to a data storage register for storing data to be operated thereon by the processing cell, said data storage register being coupled to a flag register for storing flag data to be used in the control of data transfer operations, and including means for performing flag data transfer operations, from one to another of said processing cells, each of said processing cells further including output terminals for providing stored data, processed data and flag data, each processing cell comprising:
  principal chaining input means coupling the input terminal of a processing cell to the output terminal of the preceding processing cell;
  alternate chaining channel input means responsive to said means for detecting a faulty processing cell, coupling the input terminal of a processing cell to the output terminal of a processing cell further removed along said linear processing array than said preceding processing cell for inactivating the output terminal of a faulty processing cell by selecting the output terminal of a processing cell further removed along said linear array; and
  chain channel input select logic individual to each of said processing cells for selecting between said principal chain input means and said alternate chaining channel input means.

7. The processing array of claim 6 wherein said processing array further comprises:
  a common output channel coupled to the output terminals of each of said processing cells; and
  means for disabling the output from each of cells coupled to said common output channel.

8. An array processor having means for generating a plurality of control signals, comprising:
  a plurality of data processing cells;
  means coupling adjacent processing cells together for transferring data therebetween;
  multi-bit data register in each of said processing cells;
  a plurality of common control lines for receiving said control signals coupled to each of said processing cells;
  a plurality of common input/output lines coupled to each of said processing cells;
  arithmetic means in each of said processing cells coupled to respective data registers and to said common input/output lines; and
  a flag register in each of said processing cells for controlling data flow and data processing within each respective cell, said flag register having a plurality of flag bit stores including:
    a first flag bit store means for holding data including control data, said flag bit store being selectively coupled to said adjacent processing cell by said coupling means in response to a first control signal;
    a second flag bit store means coupled to said arithmetic means for selectively recording binary output data resulting from data processing within said processing cell;
    a third flag bit store means responsive to a second control signal, and coupled to said multi-bit data register, and including means for enabling transfer of input signals to said data register from at least one of said common input/output lines;
    a fourth flag bit store means responsive to a third control signal, coupled to said multi-bit data register, and including means for selectively enabling data transfer from said data register to another one of said common input/output lines.

9. The array processor of claim 8 further comprising:
  first gating means, responsive to a fourth control signal on said common control lines for enabling the transfer of the flag bit data from said first flag bit store to another of said stores; and
  second gating means responsive to a fifth control signal for enabling the transfer to said first flag bit store of the flag bit data contained in another one of said stores.

10. The array processor of claim 8 wherein each of said data processing cells further comprises:
  third gating means, responsive to a sixth control signal on said common control lines, for directly setting the flag bit in a particular one of said flag bit stores.

11. The array processor of claim 8 wherein each of said data processing cells further comprises:
  fourth gating means responsive to a seventh control signal on said common lines, for circularly shifting flag bit data among a plurality of said flag bit stores.

12. The array processor of claim 8 wherein each of said data processing cells further comprises:
  fifth gating means, responsive to a eighth control signal on said common control lines, for forming a logical combination of flag bit data contained in predetermined ones of said stores and for transferring said logical combination to a selected one of said stores.

13. The array processor of claim 12 wherein said logical combination includes an AND function.

14. The array processor of claim 12 wherein said logical combination includes an OR function.

15. In a linear array processor having a plurality of processing cells being responsive to common control signals, each processing cell having arithmetic means for processing data, each processing cell comprising:
  a data storage register;
  a flag register coupled to said data storage register;
  a chaining channel for connecting said processing cells into a linear array;
  first gating means responsive to said common control signals and to data stored in a respective processing cell's flag register identifying data stored in said data storage register as multiplier data or as multiplicand data or as a product data or as data to be ignored during a multiply operation;
  second gating means for enabling transfer of multiplier data from another processing cell on said chaining channel to a processing cell having partial product data stored therein;

said arithmetic means for forming successive partial products by conditionally adding multiplicand data to a partial product data;

third gating means coupled to said arithmetic means enabling transfer of data to said storage register of said partial product data containing processing cell.

16. The processing array of claim 15 further comprising:

means to shift data stored in the data storage shift register of a partial product cell with respect to multiplicand data stored in the data storage register of a multiplicand cell, whereby multiplication by said arithmetic means may be implemented.

17. In a linear array processor having a plurality of processing cells being responsive to common control signals, each processing cell having arithmetic means for processing data, each processing cell comprising:

a data storage register;

a flat register coupled to said data storage register;

a chaining channel for connecting said processing cells into a linear array;

first gating means responsive to said common control signals and to data stored in a respective processing cell's flag register identifying data stored in said data storage register as divisor data as dividend remainder data or as quotient data or as data to be ignored during a divide operation;

second gating means for enabling transfer of divisor data from another processing cell on said chaining channel to a processing cell having dividend-/remainder data stored therein;

said arithmetic means for forming a revised remainder by adding or subtracting divisor data from dividend/remainder data;

third gating means coupled to said arithmetic means for enabling transfer of said revised remainder data on said chaining channel to a processing cell containing quotient data and for forming successively revised quotient data therefrom and storing the result in the data register of said quotient data containing processing cell.

* * * * *